United States Patent
Chen

(10) Patent No.: US 11,800,704 B2
(45) Date of Patent: Oct. 24, 2023

(54) MEMORY DEVICE AND MANUFACTURING METHOD FOR THE SAME

(71) Applicant: MACRONIX INTERNATIONAL CO., LTD., Hsinchu (TW)

(72) Inventor: Shih-Hung Chen, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 300 days.

(21) Appl. No.: 17/009,957

(22) Filed: Sep. 2, 2020

(65) Prior Publication Data

US 2022/0068943 A1    Mar. 3, 2022

(51) Int. Cl.
  *H10B 41/10*    (2023.01)
  *H01L 23/528*   (2006.01)
  *H10B 41/27*    (2023.01)

(52) U.S. Cl.
  CPC ......... *H10B 41/10* (2023.02); *H01L 23/5283* (2013.01); *H10B 41/27* (2023.02)

(58) Field of Classification Search
  CPC ......... H01L 27/11597; H01L 27/11514; H01L 27/2481–249; H01L 27/11551–11556; H01L 27/1128–1128; H01L 27/11512; H01L 27/11548; H01L 27/11575; H01L 27/11595; H01L 27/11504; H01L 27/11519; H01L 27/11565; H01L 27/11587
  See application file for complete search history.

(56) References Cited

U.S. PATENT DOCUMENTS

| | | | |
|---|---|---|---|
| 8,951,859 B2 | 2/2015 | Higashitani et al. | |
| 10,355,009 B1 | 7/2019 | Kai et al. | |
| 10,651,190 B2 | 5/2020 | Nagashima | |
| 2017/0133398 A1* | 5/2017 | Son | H10B 43/27 |
| 2020/0127001 A1 | 4/2020 | Hua et al. | |

FOREIGN PATENT DOCUMENTS

TW    201941369 A    10/2019

* cited by examiner

*Primary Examiner* — Amar Movva
(74) *Attorney, Agent, or Firm* — McClure, Qualey & Rodack, LLP

(57) ABSTRACT

A memory device and a manufacturing method for the same are provided. The memory device includes a stacked body structure and a staircase structure. The stacked body structure includes a first sub-stacked body structure and a second sub-stacked body structure. The staircase structure is electrically connected to the stacked body structure. The staircase structure includes a first sub-staircase structure and a second sub-staircase structure. Each of the first sub-staircase structure and the second sub-staircase structure includes a first staircase portion and a second staircase portion. The first sub-stacked body structure and the second sub-stacked body structure are respectively connected to the first staircase portion of the first sub-staircase structure and the first staircase portion of the second sub-staircase structure.

20 Claims, 22 Drawing Sheets

FIG. 3I

MEMORY DEVICE AND MANUFACTURING METHOD FOR THE SAME

BACKGROUND

Technical Field

The disclosure relates to a memory device and a manufacturing method for the same.

Description of the Related Art

With development of the semiconductor technology, semiconductor devices have become smaller in size. In the semiconductor technology, shrinking of feature sizes, and improving operation speed, efficiency, density, and cost per Integrated circuit are important objectives. For satisfy customer need and the market demand, it is important to shrink devices in size and also to maintain the electricity of devices.

SUMMARY

The present disclosure relates to a memory device and a manufacturing method for the same.

According to an embodiment, a memory device is provided. The memory device comprises a stacked body structure and a staircase structure. The stacked body structure comprises a first sub-stacked body structure and a second sub-stacked body structure. The staircase structure is electrically connected to the stacked body structure. The staircase structure comprises a first sub-staircase structure and a second sub-staircase structure. Each of the first sub-staircase structure and the second sub-staircase structure comprises a first staircase portion and a second staircase portion. The first sub-stacked body structure and the second sub-stacked body structure are respectively connected to the first staircase portion of the first sub-staircase structure and the first staircase portion of the second sub-staircase structure.

According to another embodiment, a manufacturing method for a memory device is provided. The method comprises the following steps. Conductive layers and insulating layers are stacked alternately along a vertical direction to form a stacked structure. The stacked structure comprises a first stacked portion, a second stacked portion and another first stacked portion disposed along a first direction. The first stacked portion and the another first stacked portion are respectively on opposing sides of the second stacked portion. The first stacked portion and the another first stacked portion are in a staircase contact region. The second stacked portion is in a memory array region. The first stacked portion and the another first stacked portion are etched with using photoresist layers to form a staircase structure. In the staircase contact region, sizes of the photoresist layers in the first direction and/or a second direction are different from each other. The first direction, the second direction and the vertical direction are perpendicular to each other. The memory device comprises a stacked body structure and the staircase structure. The stacked body structure comprises a first sub-stacked body structure and a second sub-stacked body structure. The first sub-stacked body structure and the second sub-stacked body structure comprise the second stacked portion. The staircase structure is electrically connected to the stacked body structure, and comprises a first sub-staircase structure and a second sub-staircase structure. Each of the first sub-staircase structure and the second sub-staircase structure comprises a first staircase portion and a second staircase portion. The first sub-stacked body structure and the second sub-stacked body structure are respectively connected to the first staircase portion of the first sub-staircase structure and the first staircase portion of the second sub-staircase structure.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Figure 1:
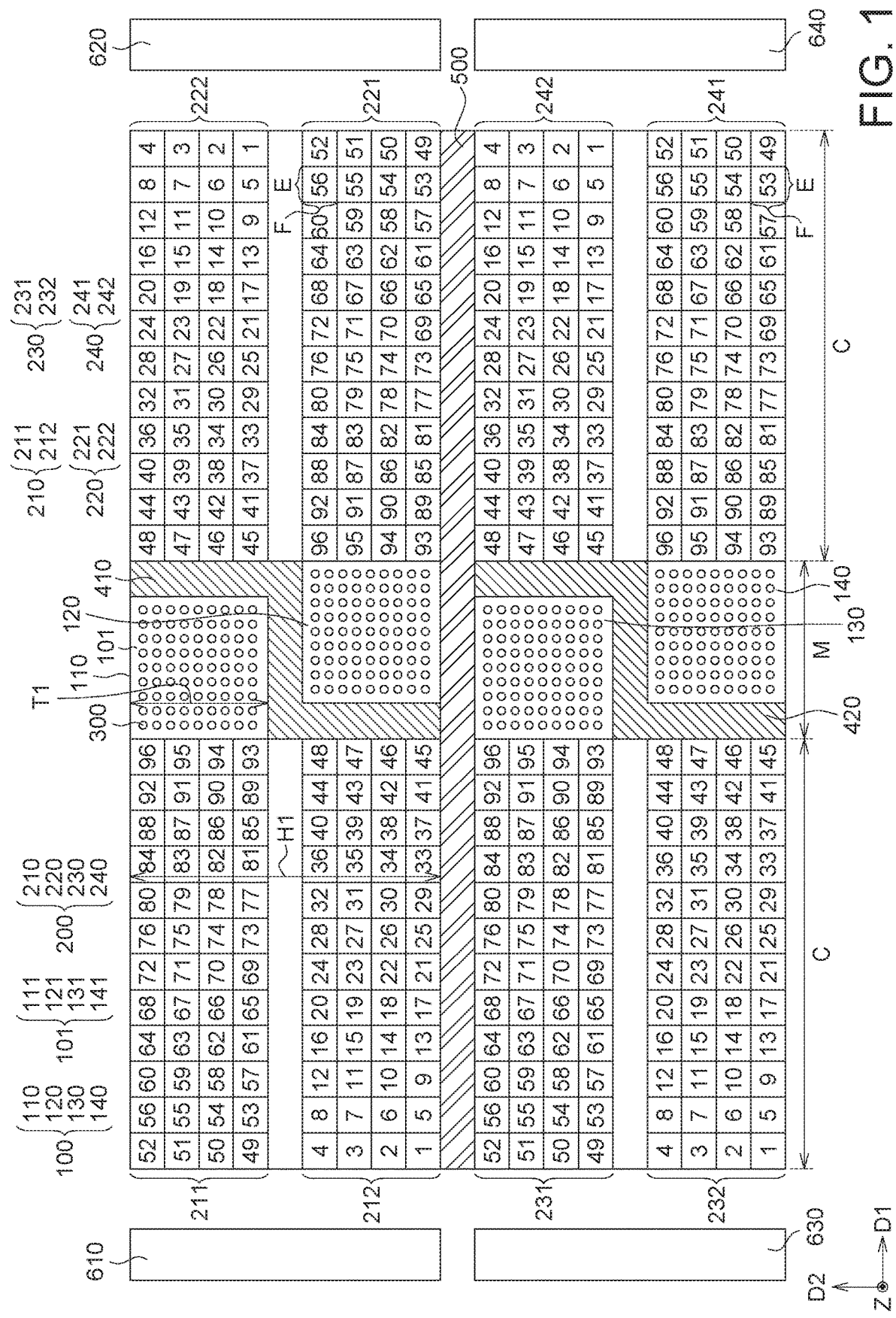
FIG. 1 is a top view diagram of a memory device according to an embodiment.

FIG. 1 is referred to, which is a top view diagram of a memory device according to an embodiment. The memory device comprises a stacked body structure 100 and a staircase structure 200. The staircase structure 200 is electrically connected with the stacked body structure 100. The staircase structure 200 and the stacked body structure 100 comprise conductive layers and insulating layers stacked alternately along a vertical direction Z. The conductive layers of the staircase structure 200 and the stacked body structure 100 are electrically connected with each other. The vertical direction Z, a first direction D1 and a second direction D2 may be perpendicular to each other.

In an embodiment, the staircase structure 200 and the stacked body structure 100 have the conductive layers of an amount of 96 layers. The conductive layers of the staircase structure 200 have conductive stair layers of 96 levels disposed as a staircase, as shown in FIG. 1. The conductive layers of the staircase structure 200 comprise, from a bottom level to a top level, a conductive stair layer 1 in $1^{st}$ level (bottom level), a conductive stair layer 2 in the $2^{nd}$ level, a conductive stair layer 3 in the $3^{rd}$ level . . . , to a conductive stair layer 94 in the $94^{th}$ level, a conductive stair layer 95 in the $95^{th}$ level, and a conductive stair layer 96 in the $96^{th}$ level (top level). The staircase structure 200 has 96 stair units respectively having the conductive stair layer 1, the conductive stair layer 2, the conductive stair layer 3, to the conductive stair layer 94, the conductive stair layer 95 and the conductive stair layer 96. The stair unit has a stair size E in the first direction D1, and has a stair size F in the second direction D2. However, the present disclosure is not limited thereto.

The stacked body structure 100 may comprise a first sub-stacked body structure 110, a second sub-stacked body structure 120, a third sub-stacked body structure 130 and a fourth sub-stacked body structure 140. The first sub-stacked body structure 110, the second sub-stacked body structure 120, the third sub-stacked body structure 130 and the fourth sub-stacked body structure 140 are in a memory array region M. The first sub-stacked body structure 110, the second sub-stacked body structure 120, the third sub-stacked body structure 130 and the fourth sub-stacked body structure 140 may be arranged along the second direction D2. In this embodiment, each of the first sub-stacked body structure 110, the second sub-stacked body structure 120, the third sub-stacked body structure 130 and the fourth sub-stacked body structure 140 has a uniform size T1 in the second direction D2. For example, the sub-stacked body structure (such as the first sub-stacked body structure 110, the second sub-stacked body structure 120, the third sub-stacked body structure 130 and the fourth sub-stacked body structure 140) comprises a first stacked body portion 101. In other words, the first sub-stacked body structure 110 comprises a first stacked body portion 111. The second sub-stacked body structure 120 comprises a first stacked body portion 121. The third sub-stacked body structure 130 comprises a first stacked body portion 131. The fourth sub-stacked body structure 140 comprises a first stacked body portion 141. The first stacked body portion 101 (the first stacked body portion 111 the first stacked body portion 121, the first stacked body portion 131, the first stacked body portion 141) may have the uniform the size T1 in the second direction D2.

Memory cells are defined in the first stacked body portions 101 of the first sub-stacked body structure 110, the second sub-stacked body structure 120, the third sub-stacked body structure 130 and the fourth sub-stacked body structure 140. For example, pillar elements 300 may be formed in the stacked body structure 100. The pillar elements 300 are extended through the stacked body structure 100 along the vertical direction Z. In an embodiment, the pillar element 300 comprises a channel pillar. A memory material layer is disposed between the channel pillar and the conductive layer. The memory cells of NAND flash memory array are defined in the memory material layer at intersections between the channel pillars and the conductive layers. The conductive layers are functioned as word lines. The channel pillars are electrically connected to bit lines. In an embodiment, a NAND chip is trapping layer design. In an embodiment, a NAND chip is floating gated design. In an embodiment, a NAND chip is circuit-under-array design.

The staircase structure 200 may comprise a first sub-staircase structure 210, a second sub-staircase structure 220, a third sub-staircase structure 230 and a fourth sub-staircase structure 240. The first sub-staircase structure 210, the second sub-staircase structure 220, the third sub-staircase structure 230 and the fourth sub-staircase structure 240 are in a staircase contact region C. The first sub-staircase structure 210 comprises a first staircase portion 211 and a second staircase portion 212. Stair levels (i.e. the 49$^{th}$ level to the 96$^{th}$ level) of the first staircase portion 211 are higher than stair levels (i.e. the 1$^{st}$ level to the 48$^{th}$ level) of the second staircase portion 212. The first sub-stacked body structure 110 is connected to the first staircase portion 211 of the first sub-staircase structure 210. The first staircase portion 211 of the first sub-staircase structure 210 is electrically connected between the second staircase portion 212 of the first sub-staircase structure 210 and the first sub-stacked body structure 110.

The second sub-staircase structure 220 comprises a first staircase portion 221 and a second staircase portion 222. Stair levels (i.e. the 49$^{th}$ level to the 96$^{th}$ level) of the first staircase portion 221 are higher than stair levels (i.e. the 1$^{st}$ level to the 48$^{th}$ level) of the second staircase portion 222. The second sub-stacked body structure 120 is connected to the first staircase portion 221 of the second sub-staircase structure 220. The first staircase portion 221 of the second sub-staircase structure 220 is electrically connected between the second staircase portion 222 of the second sub-staircase structure 220 and the second sub-stacked body structure 120.

The first sub-stacked body structure 110 is between the first staircase portion 211 of the first sub-staircase structure 210 and the second staircase portion 222 of the second sub-staircase structure 220. The second sub-stacked body structure 120 is between the second staircase portion 212 of the first sub-staircase structure 210 and the first staircase portion 221 of the second sub-staircase structure 220. A size H1 of the first sub-staircase structure 210 in the second direction D2 may be smaller than the size T1 of the first sub-stacked body structure 110. For example, the size H1 may be about the double of the size T1.

The relations among the third sub-stacked body structure 130, the fourth sub-stacked body structure 140, the third sub-staircase structure 230 and the fourth sub-staircase structure 240 are similar with the relations among the first sub-stacked body structure 110, the second sub-stacked body structure 120, the first sub-staircase structure 210 and the second sub-staircase structure 220. For example, the third sub-staircase structure 230 may comprise a first staircase portion 231 and a second staircase portion 232. The fourth sub-staircase structure 240 may comprise a first staircase portion 241 and a second staircase portion 242. The third sub-stacked body structure 130 is connected to the first staircase portion 231 of the third sub-staircase structure 230. The fourth sub-stacked body structure 140 is connected to the first staircase portion 241 of the fourth sub-staircase structure 240. Other structural characteristics can be realized by the analogy.

The conductive layers of the first sub-stacked body structure 110 and the first sub-staircase structure 210 may be electrically insulated from the conductive layers of the second sub-stacked body structure 120 and the second sub-staircase structure 220 an insulating element 410. The insulating element 410 is between the first sub-stacked body structure 110 and the second staircase portion 222 of the second sub-staircase structure 220, between the first sub-stacked body structure 110 and the second sub-stacked body structure 120, and between the second sub-stacked body structure 120 and the second staircase portion 212 of the first sub-staircase structure 210. The relation of the insulating element 420 relative to the third sub-stacked body structure 130, the fourth sub-stacked body structure 140, the third sub-staircase structure 230 and the fourth sub-staircase structure 240 can be realized by the analogy. The insulating element 410 and the insulating element 420 may have a shape of ⌐ .

The conductive layers of the first sub-staircase structure 210, the second sub-stacked body structure 120 and the second sub-staircase structure 220 may be electrically insulated from the conductive layers of the third sub-staircase structure 230, the third sub-stacked body structure 130 and of the fourth sub-staircase structure 240 by a dielectric element 500. The dielectric element 500 may be between the second staircase portion 212 of the first sub-staircase structure 210 and the first staircase portion 231 of the third sub-staircase structure 230, between the insulating element 410 and the third sub-stacked body structure 130, between the second sub-stacked body structure 120 and the third sub-stacked body structure 130, between the second sub-stacked body structure 120 and the insulating element 420, and between the first staircase portion 221 of the second sub-staircase structure 220 and the second staircase portion 242 of the fourth sub-staircase structure 240.

The conductive layers (word lines) of the first sub-stacked body structure 110 and the first sub-staircase structure 210 may be electrically connected to a word line driver 610 through the conductive stair layers 1-96 of the first sub-staircase structure 210 and conductive plugs (not shown) on which. The conductive layers (word lines) of the second sub-stacked body structure 120 and the second sub-staircase structure 220 may be electrically connected to a word line driver 620 through the conductive stair layers 1-96 of the second sub-staircase structure 220 and conductive plugs (not shown) on which. The conductive layers (word lines) of the third sub-stacked body structure 130 and the third sub-staircase structure 230 may be electrically connected to a word line driver 630 through the conductive stair layers 1-96 of the third sub-staircase structure 230 and conductive plugs (not shown) on which. The conductive layers (word lines) of the fourth sub-stacked body structure 140 and the fourth sub-staircase structure 240 may be electrically connected to a word line driver 640 through the conductive stair layers 1-96 of the fourth sub-staircase structure 240 and conductive plugs (not shown) on which. In other words, the first sub-staircase structure 210, the second sub-staircase structure 220, the third sub-staircase structure 230 and the fourth sub-staircase structure 240 may be referred to as effective staircase structures. In embodiments, there is no dummy staircase structure (conductive layers of which is electrically floating) disposed between the first sub-staircase structure 210 and the third sub-staircase structure 230. Also, there is no dummy staircase structure disposed between the second sub-staircase structure 220 and the fourth sub-staircase structure 240. Therefore, a density of effective devices on a wafer can be increased. One block of the memory cells defined in each of the first sub-stacked body structure 110, the second sub-stacked body structure 120, the third sub-stacked body structure 130 and the fourth sub-stacked body structure 140 may be selected or controlled, or erased at the same time by corresponding one of the word line driver 610, the word line driver 620, the word line driver 630, and the word line driver 640.

Figure 2:
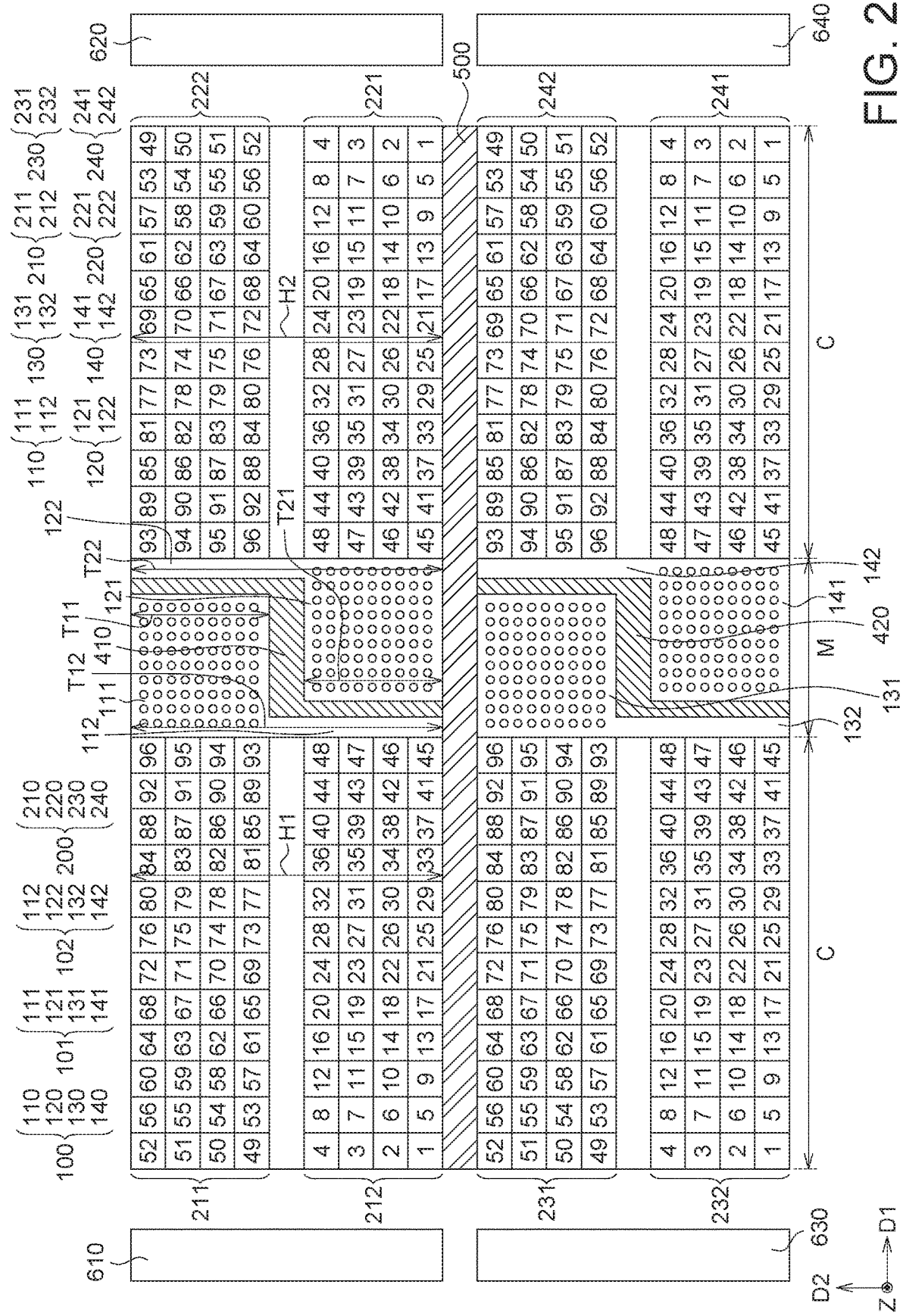
FIG. 2 is a top view diagram of a memory device according to another embodiment.

FIG. 2 is referred to, which is a top view diagram of a memory device according to another embodiment. The memory device of FIG. 2 is different from the memory device of FIG. 1 with the following description. Each of the first sub-stacked body structure 110, the second sub-stacked body structure 120, the third sub-stacked body structure 130 and the fourth sub-stacked body structure 140 further comprises a second stacked body portion 102 connected with the first stacked body portion 101. The first stacked body portion 111 and a second stacked body portion 112 of the first sub-stacked body structure 110 are connected with each other. The first stacked body portion 121 and a second stacked body portion 122 of the second sub-stacked body structure 120 are connected with each other. The first stacked body portion 131 and a second stacked body portion 132 of the third sub-stacked body structure 130 are connected with each other. The first stacked body portion 141 and a second stacked body portion 142 of the fourth sub-stacked body structure 140 are connected with each other.

For example, the second stacked body portion 112 of the first sub-stacked body structure 110 is between the first stacked body portion 121 of the second sub-stacked body structure 120 and the second staircase portion 212 of the first sub-staircase structure 210. The second stacked body portion 122 of the second sub-stacked body structure 120 is between the first stacked body portion 111 of the first sub-stacked body structure 110 and the second staircase portion 222 of the second sub-staircase structure 220. The second stacked body portion 112 of the first sub-stacked body structure 110 is connected to the second staircase portion 212 of the first sub-staircase structure 210, and therefore can provide a shorter electrical connection path and a lower resistance to the first sub-staircase structure 210. The second stacked body portion 122 of the second sub-stacked body structure 120 is connected to the second staircase portion 222 of the second sub-staircase structure 220, and therefore can provide a shorter electrical connection path and a lower resistance to the second sub-staircase structure 220. The relations among the third sub-stacked body structure 130, the fourth sub-stacked body structure 140, the third sub-staircase structure 230 and the fourth sub-staircase structure 240 are similar with the relations among the first sub-stacked body structure 110, the second sub-stacked body structure 120, the first sub-staircase structure 210 and the second sub-staircase structure 220. Therefore, the other structural characteristics of the second stacked body portion 132 of the third sub-stacked body structure 130 and the second stacked body portion 142 of the fourth sub-stacked body structure 140, and relations of which relative to other elements can be realized by the analogy.

Each of the first sub-stacked body structure 110, the second sub-stacked body structure 120, the third sub-stacked body structure 130 and the fourth sub-stacked body structure 140 has a varied size in the second direction D2. For example, the first sub-stacked body structure 110, the second sub-stacked body structure 120, the third sub-stacked body structure 130 and the fourth sub-stacked body structure 140 individually have a L shape. A portion of the first sub-stacked body structure 110 away from the first sub-staircase structure 210 has a size T11 in the second direction D2 (equal to a size T1 of the first stacked body portion 111 in the second direction D2) is smaller than a size T12 of another portion of the first sub-stacked body structure 110 in the second direction D2 adjacent to the first sub-staircase structure 210 (i.e. the sum of the size T1 of the first stacked body portion 111 in the second direction D2 and a size of the second stacked body portion 112 in the second direction D2). The size H1 of the first sub-staircase structure 210 in the second direction D2 may be smaller than the size T11 of the portion of the first sub-stacked body structure 110 away from the first sub-staircase structure 210 in the second direction D2. For example, the size H1 may be about the double of the size T11. The size H1 of the first sub-staircase structure 210 may be equal to the size T12 of the another portion of the first sub-stacked body structure 110 adjacent to the first sub-staircase structure 210. Similarly, a portion of the second sub-stacked body structure 120 away from the second sub-staircase structure 220 has a size T21 in the second direction D2 (equal to the size T1 of the first stacked body portion 121 in the second direction D2) is smaller than a size T22 of another portion of the second sub-stacked body structure 120 in the second direction D2 adjacent to the second sub-staircase structure 220 (i.e, the sum of the size T1 of the first stacked body portion 121 in the second direction D2 and a size of the second stacked body portion 122 in the second direction D2). A size H2 of the second sub-staircase structure 220 in the second direction D2 may be smaller than the size T21 of the portion of the second sub-stacked body structure 120 away from the second sub-staircase structure 220 in the second direction D2. For example, the size H2 may be about the double of the size T21. The size H2 of the second sub-staircase structure 220 may be equal to the size T22 of the another portion of the second sub-stacked body structure 120 adjacent to the second sub-staircase structure 220 in the second direction D2. Size characteristics for the third sub-stacked body structure 130 and the fourth sub-stacked body structure 140 can be realized by the analogy.

In this embodiment, stair levels (i.e. the $49^{th}$ level to the $96^{th}$ level) of the first staircase portion 211 are higher than stair levels (i.e. the $1^{st}$ level to the $48^{th}$ level) of the second staircase portion 212 of the first sub-staircase structure 210. Stair levels (i.e. the $1^{st}$ level to the $48^{th}$ level) of the first staircase portion 221 are lower than stair levels (i.e. the $49^{th}$ level to the $96^{th}$ level) of the second staircase portion 222 of the second sub-staircase structure 220. Stair levels (i.e. the $49^{th}$ level to the $96^{th}$ level) of the first staircase portion 231 are higher than stair levels (i.e. the $1^{st}$ level to the $48^{th}$ level) of the second staircase portion 232 of the third sub-staircase structure 230. Stair levels (i.e. the $1^{st}$ level to the $48^{th}$ level) of the first staircase portion 241 are lower than stair levels (i.e. the $49^{th}$ level to the $96^{th}$ level) of the second staircase portion 242 of the fourth sub-staircase structure 240. However, the present disclosure is not limited thereto. The amount and disposition for the stair levels may be varied according to actual demands for process and product.

The insulating element 410 is between the first stacked body portion 111 of the first sub-stacked body structure 110 and the second stacked body portion 122 of the second sub-stacked body structure 120, between the first stacked body portion 111 of the first sub-stacked body structure 110 and the first stacked body portion 121 of the second sub-stacked body structure 120, and between the second stacked body portion 112 of the first sub-stacked body structure 110 and the first stacked body portion 121 of the second sub-stacked body structure 120. The relations of the insulating element 420 relative to the third sub-stacked body structure 130 and the fourth sub-stacked body structure 140 can be realized by the analogy.

The conductive layers of the first sub-staircase structure 210, the first sub-stacked body structure 110, the second sub-stacked body structure 120 and the second sub-staircase structure 220 may be electrically insulated from the conductive layers of the third sub-staircase structure 230, the third sub-stacked body structure 130, the fourth sub-stacked body structure 140 and the fourth sub-staircase structure 240 by the dielectric element 500. The dielectric element 500 may be between the second staircase portion 212 of the first sub-staircase structure 210 and the first staircase portion 231 of the third sub-staircase structure 230, between the second stacked body portion 112 of the first sub-stacked body structure 110 and the first stacked body portion 131 of the third sub-stacked body structure 130, between the insulating element 410 and the first stacked body portion 131 of the third sub-stacked body structure 130, between the first stacked body portion 121 of the second sub-stacked body structure 120 and the first stacked body portion 131 of the third sub-stacked body structure 130, between the first stacked body portion 121 of the second sub-stacked body structure 120 and the insulating element 420, between the first stacked body portion 121 of the second sub-stacked body structure 120 and the second stacked body portion 142 of the fourth sub-stacked body structure 140, and between the first staircase portion 221 of the second sub-staircase structure 220 and the second staircase portion 242 of the fourth sub-staircase structure 240.

Figure 3A:
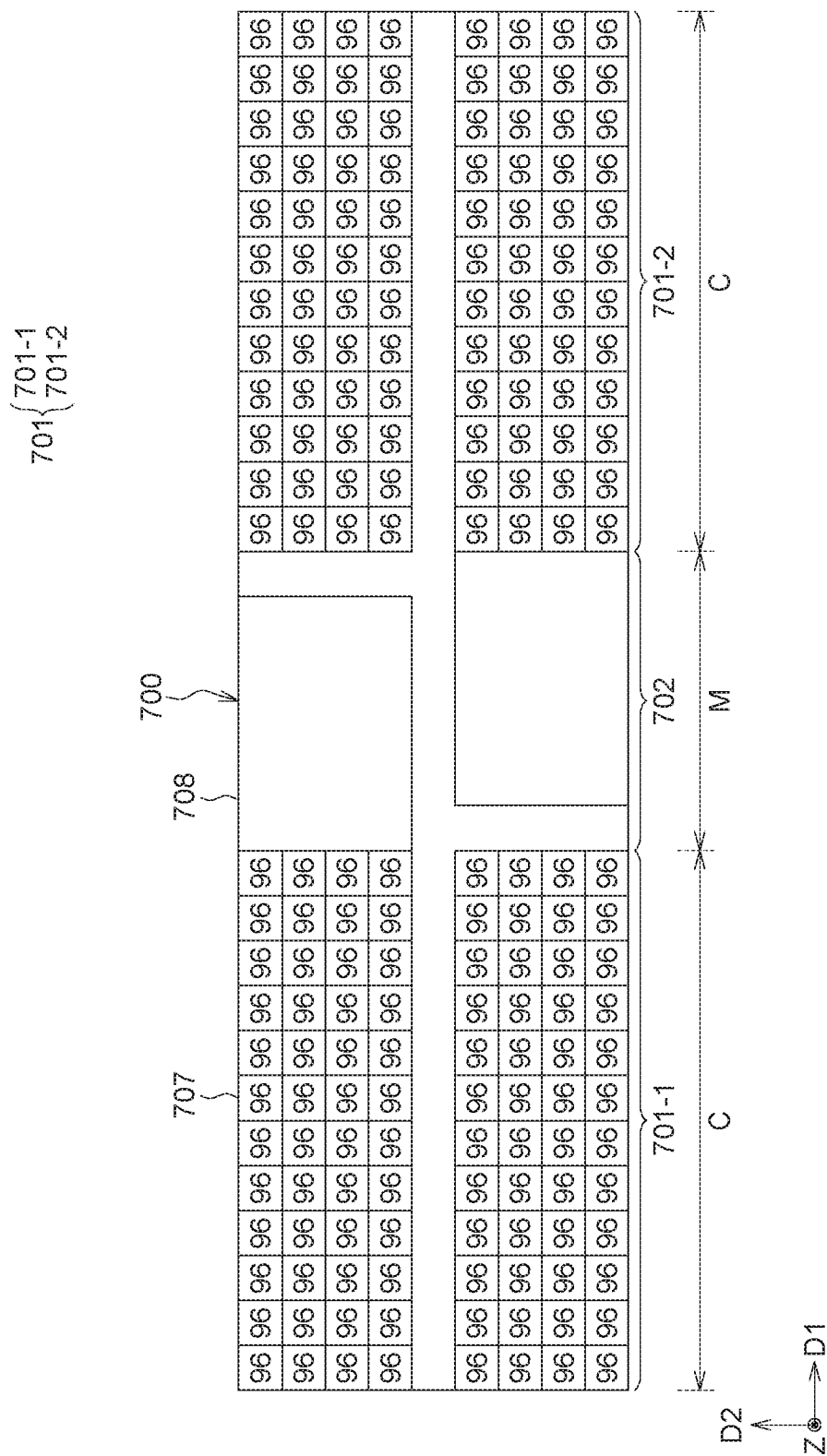
FIG. 3A to FIG. 3T illustrate a manufacturing method for memory device in an embodiment.
Figure 3B:
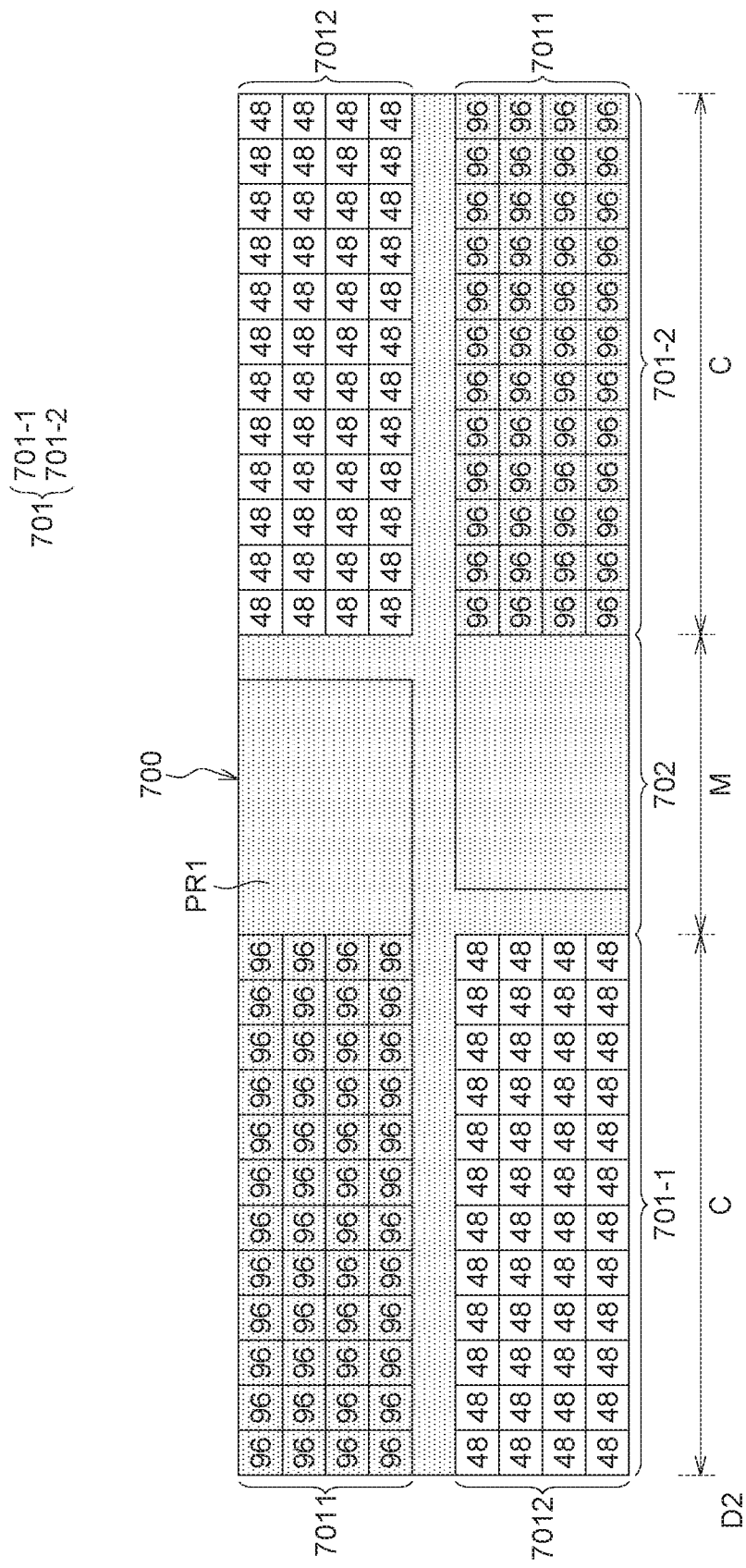
Figure 3C:
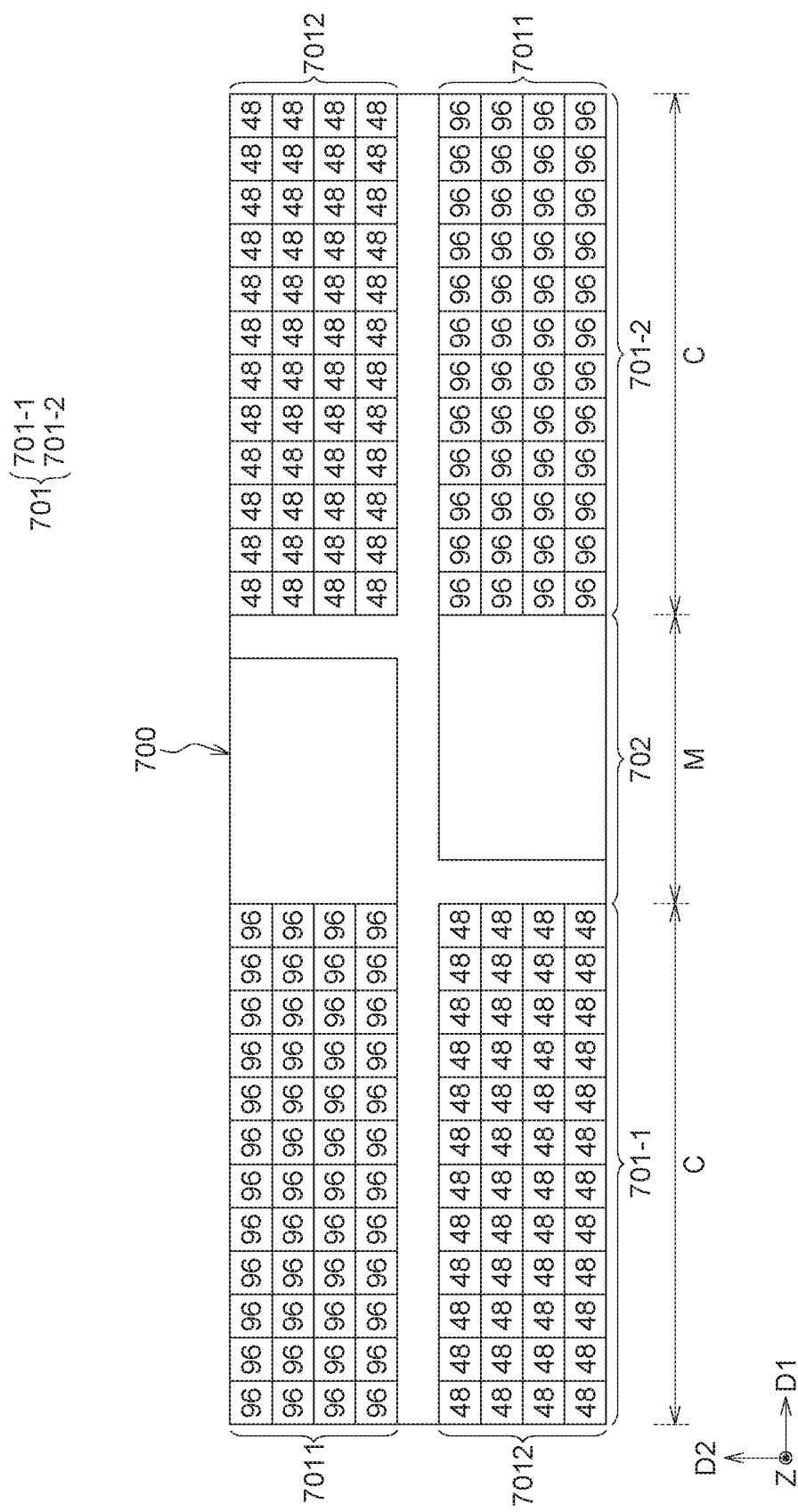
Figure 3D:
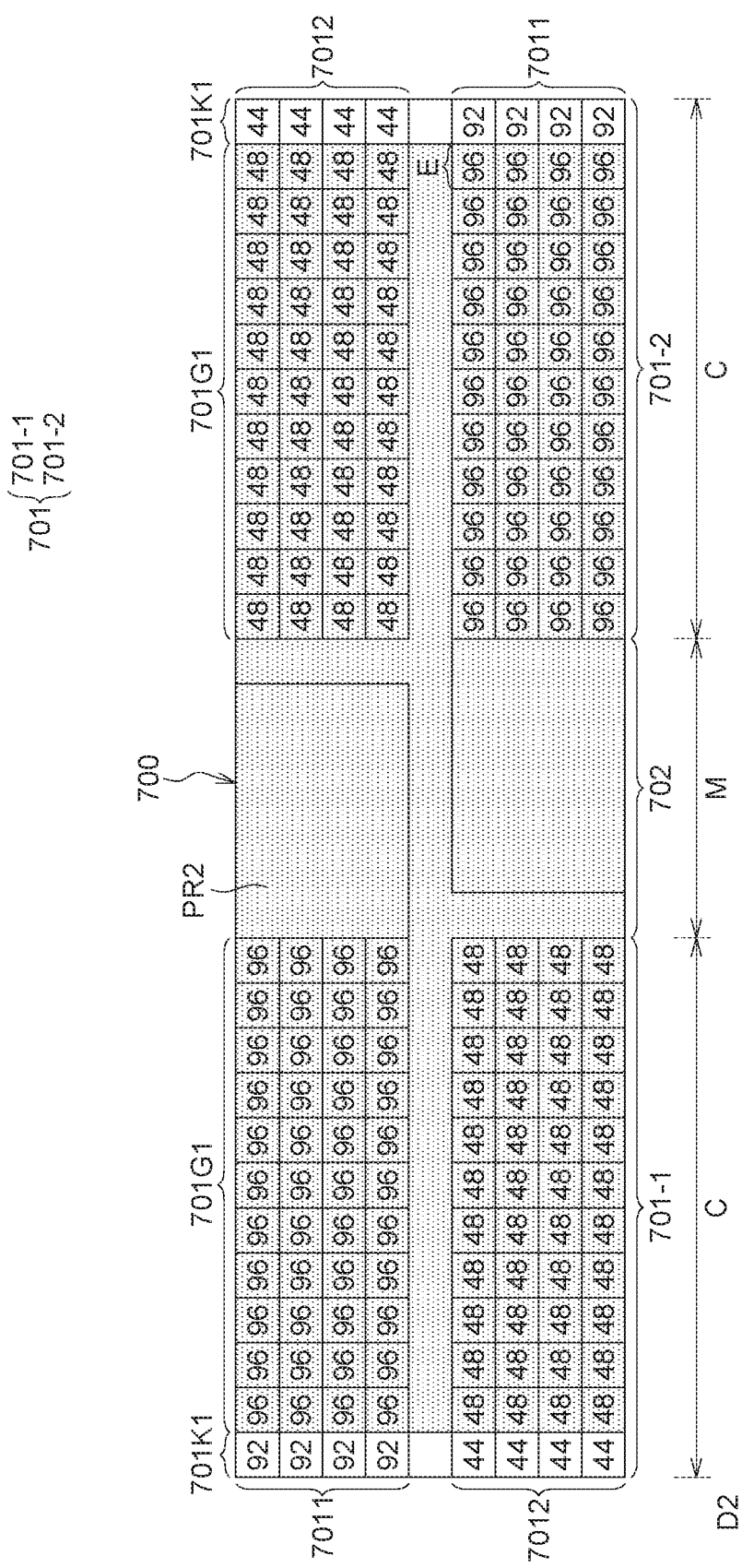
Figure 3E:
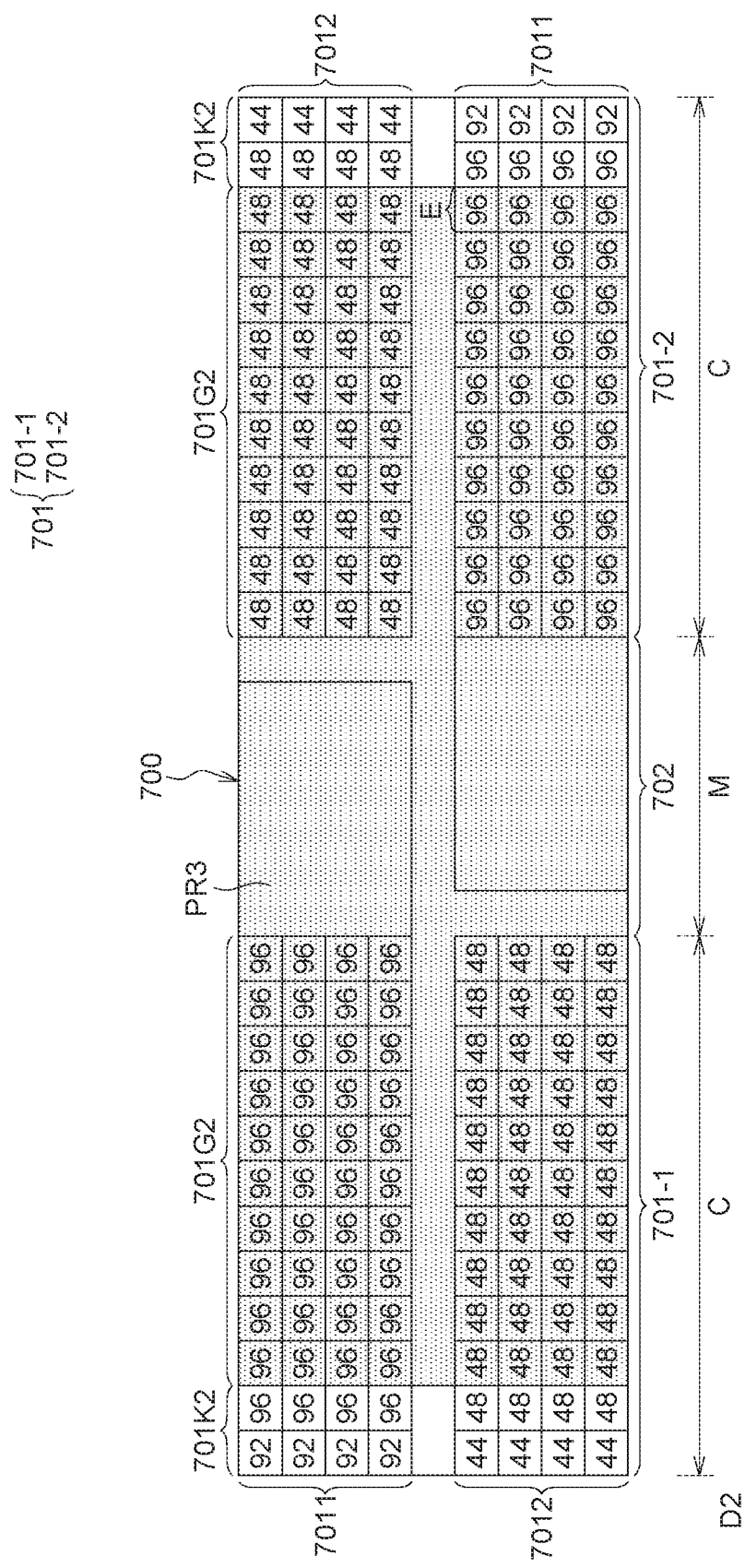
Figure 3F:
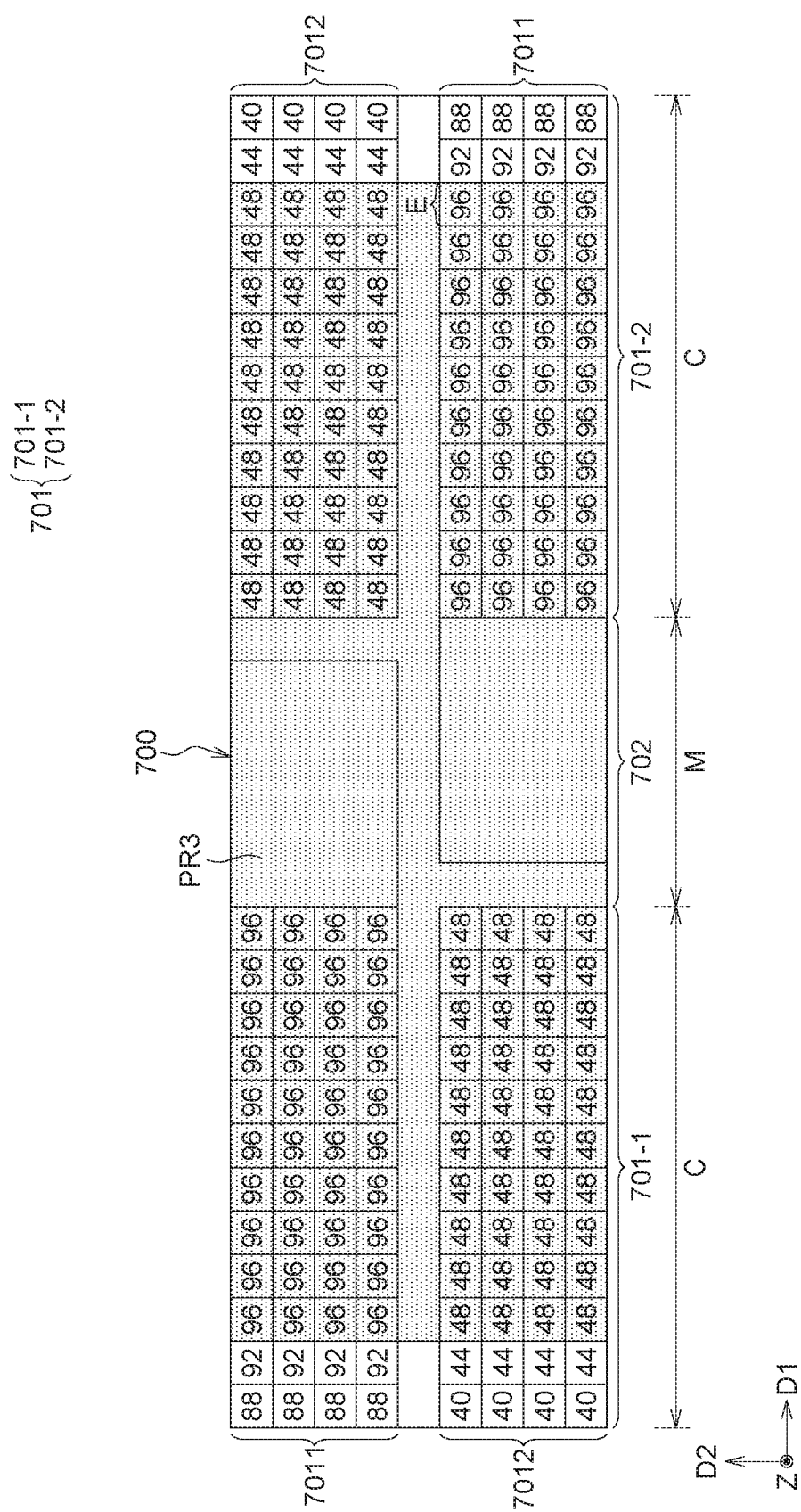
Figure 3G:
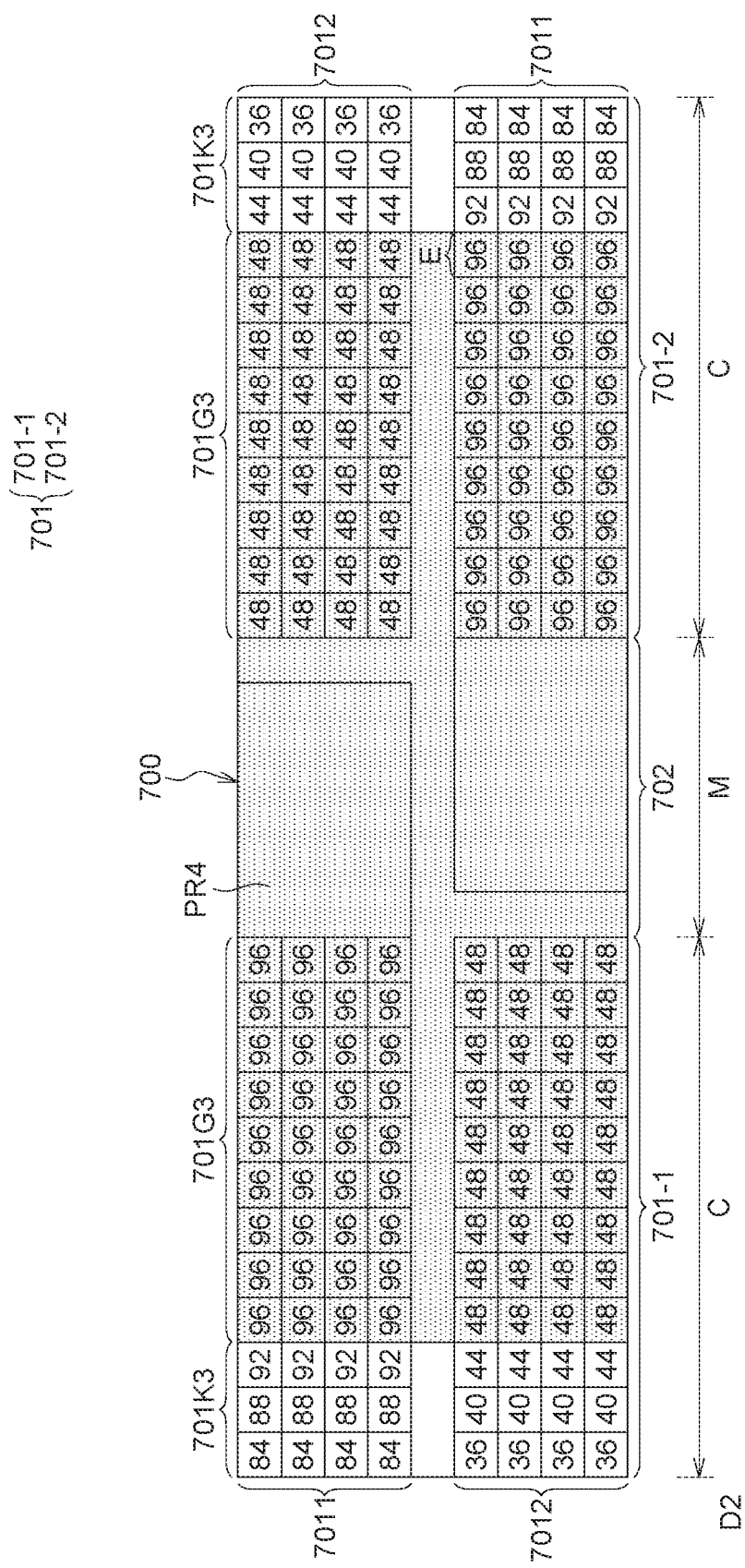
Figure 3H:
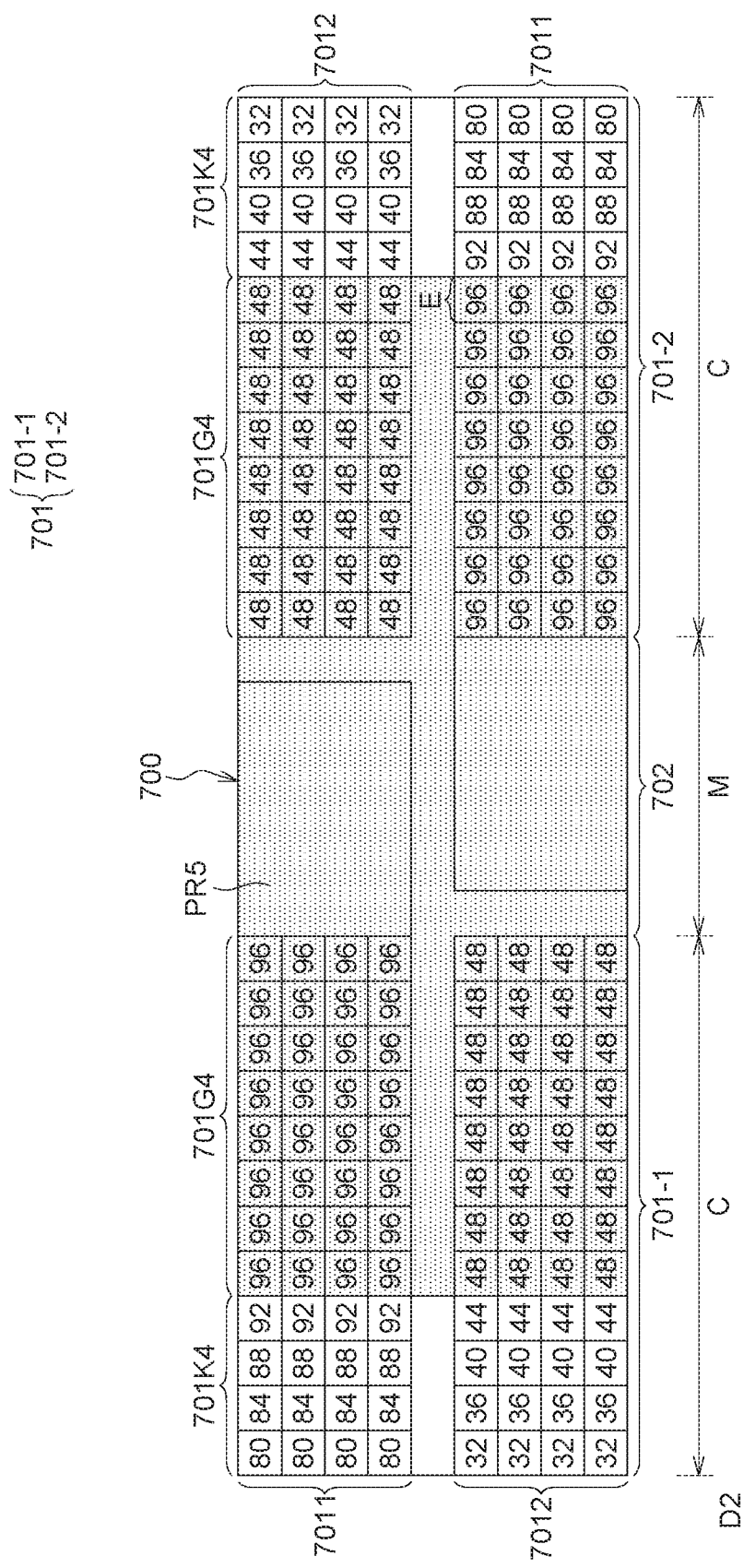
Figure 3I:
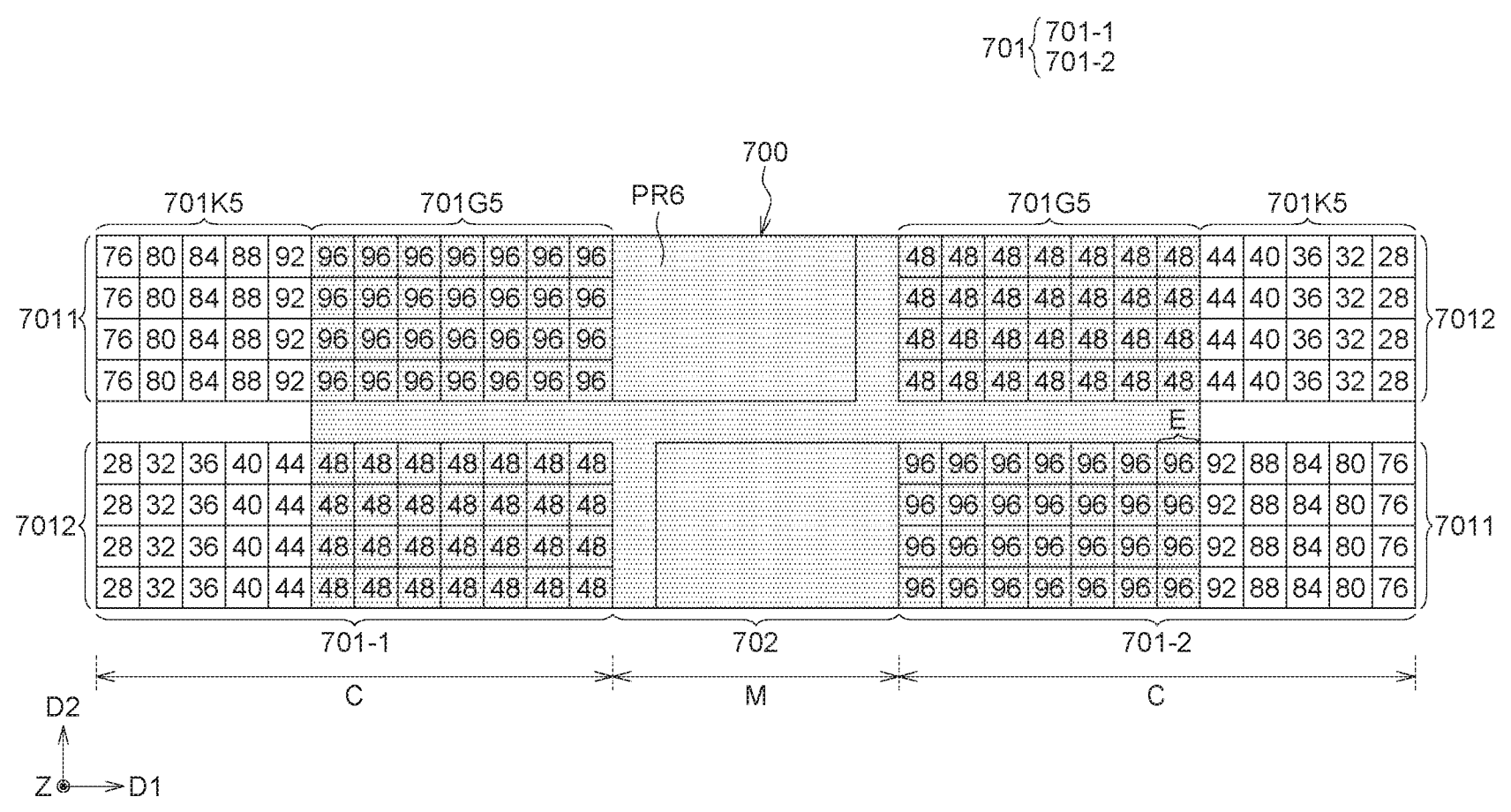
Figure 3J:
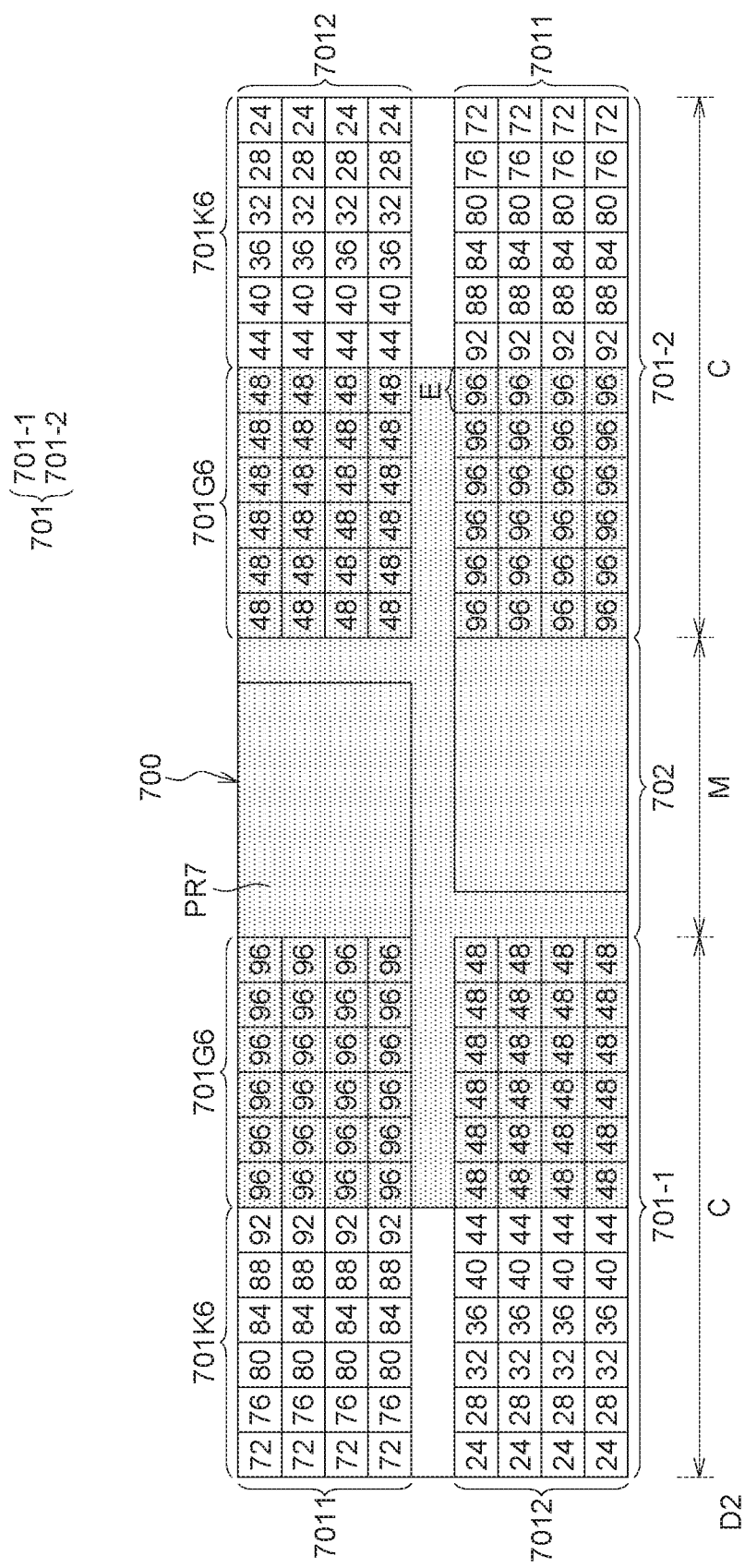
Figure 3K:
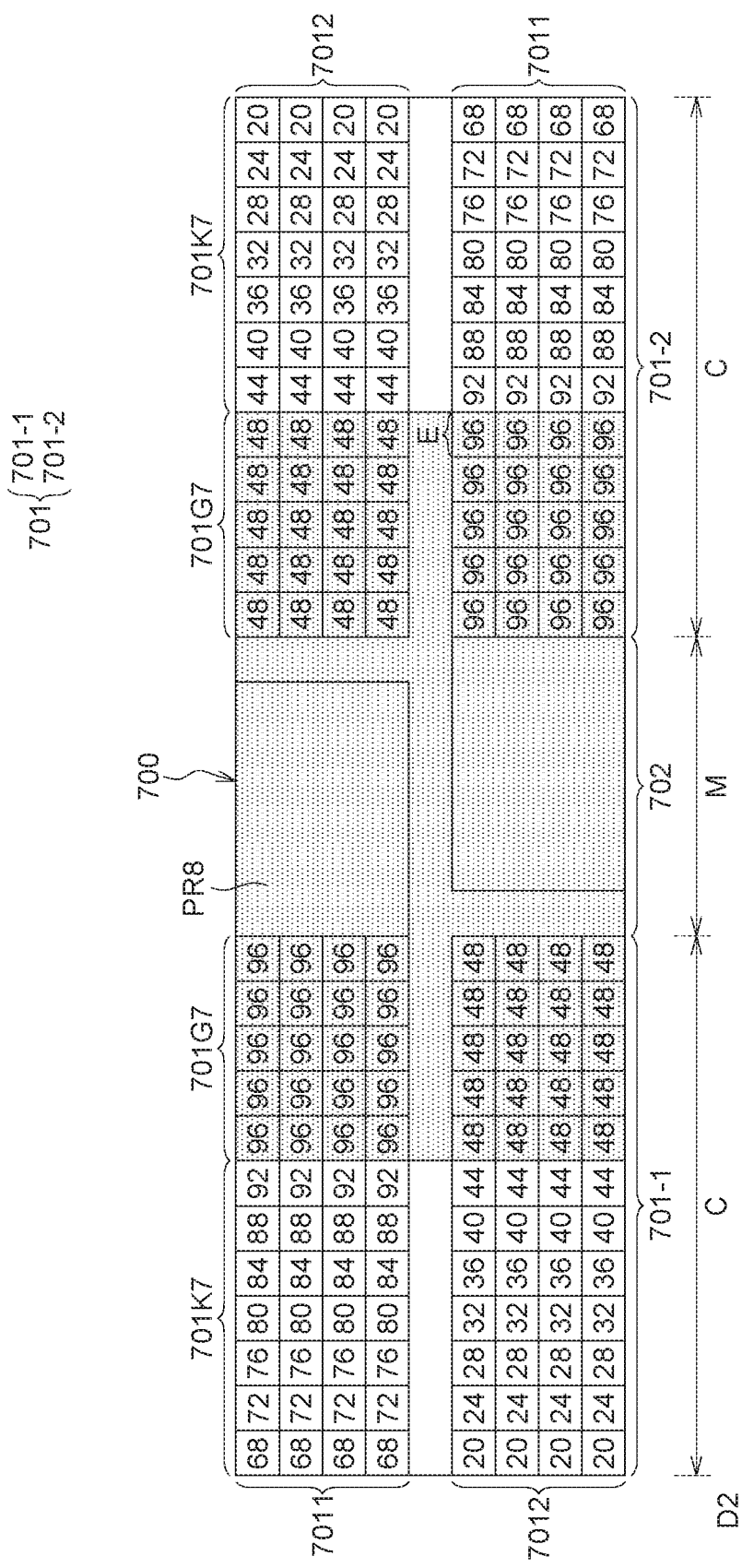
Figure 3L:
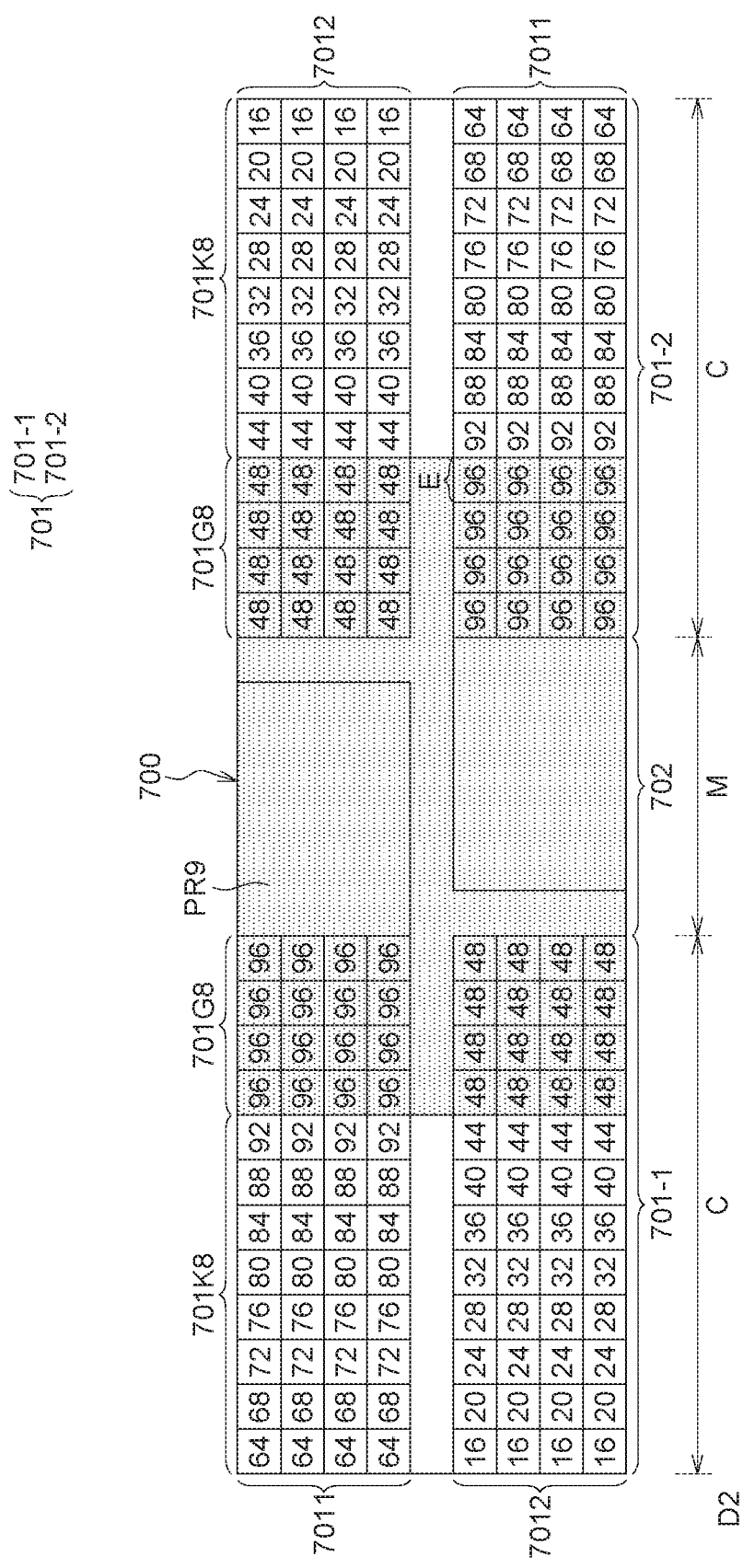
Figure 3M:
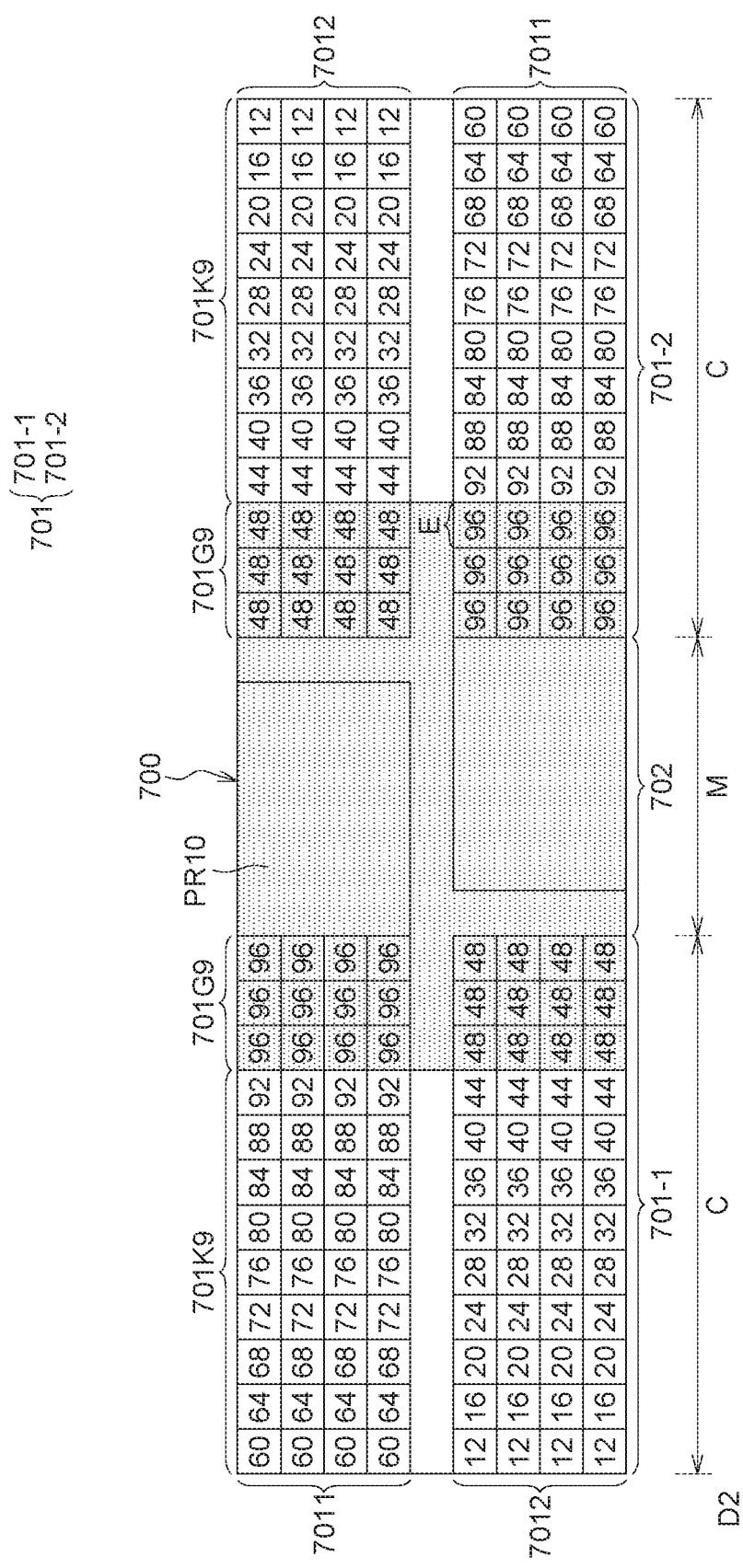
Figure 3N:
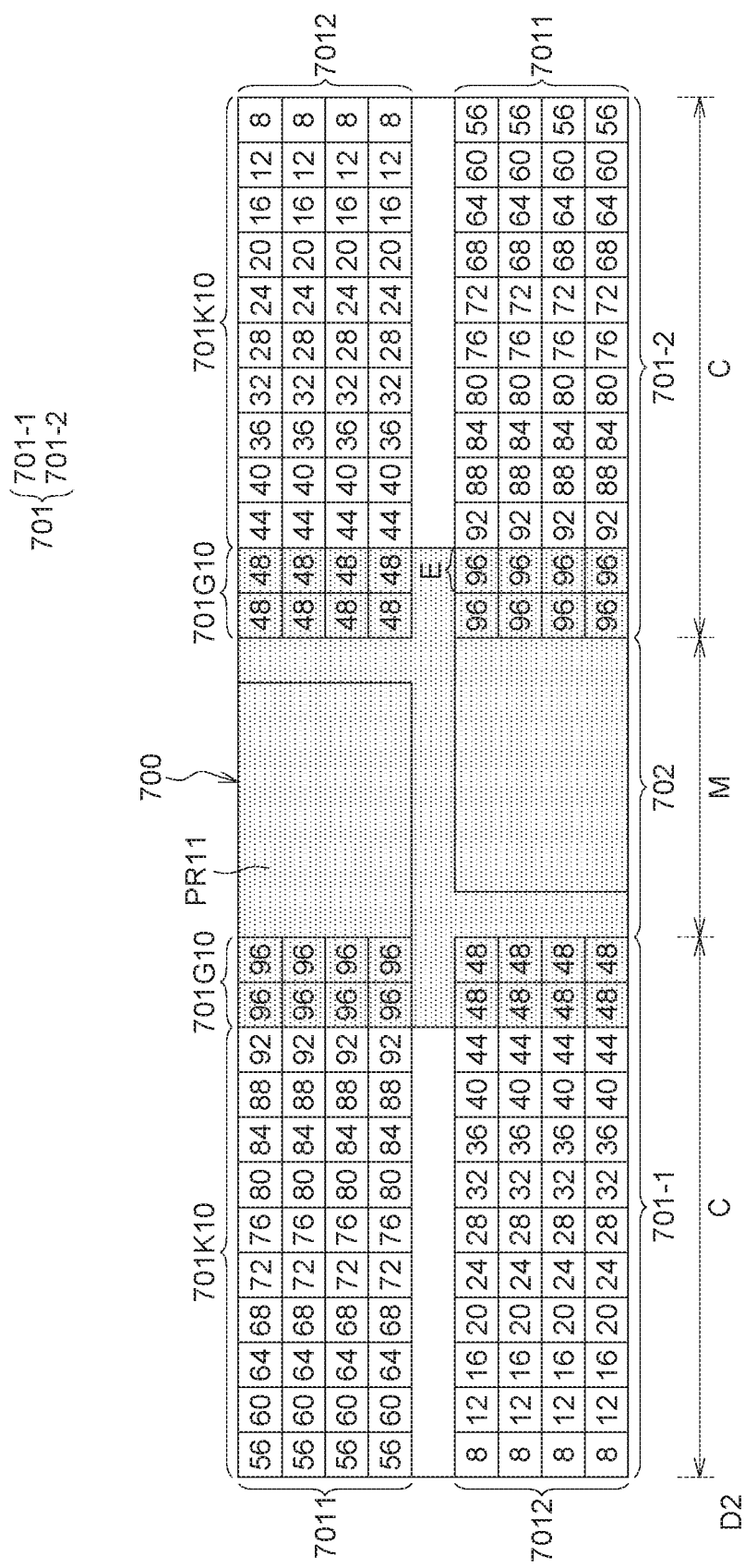
Figure 3O:
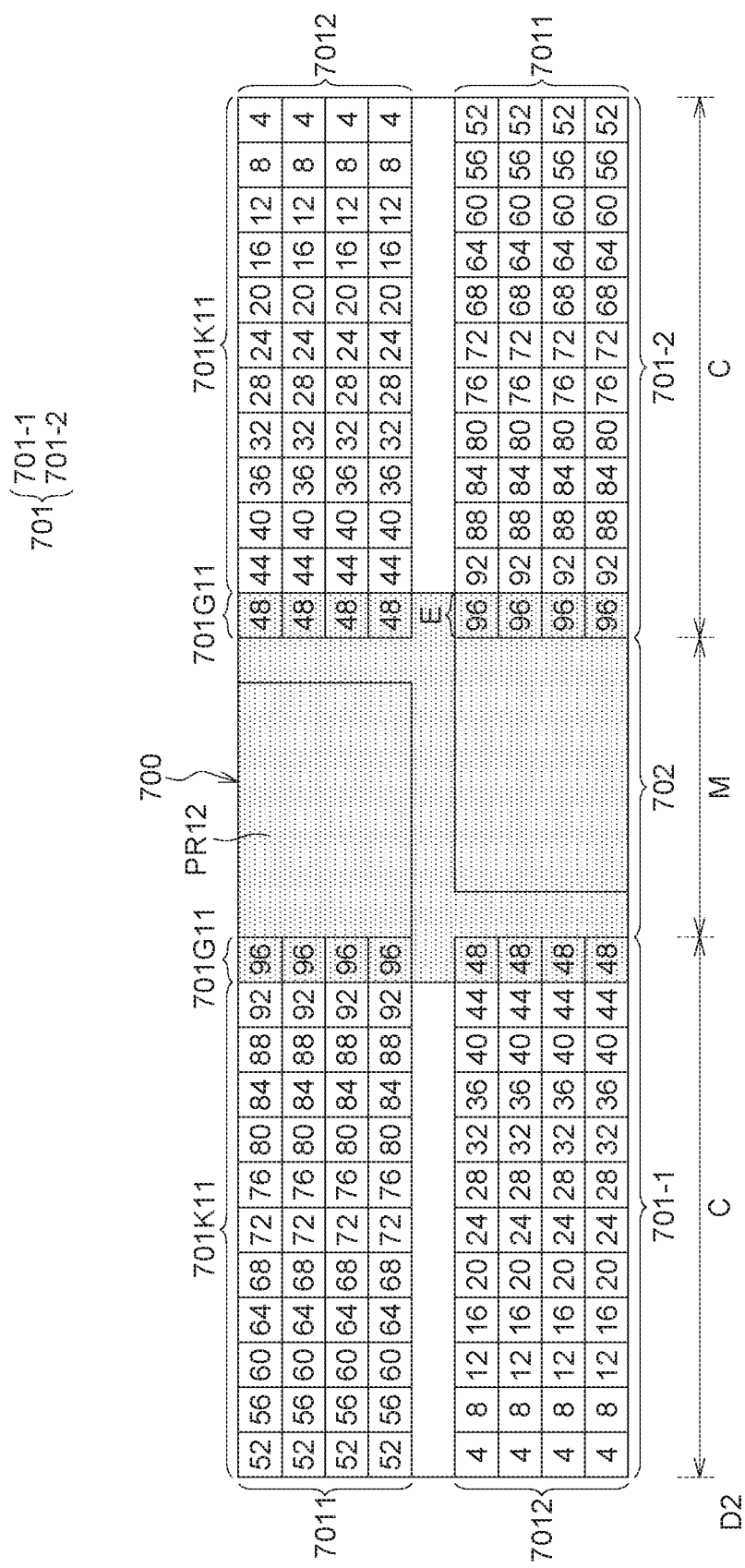
Figure 3P:
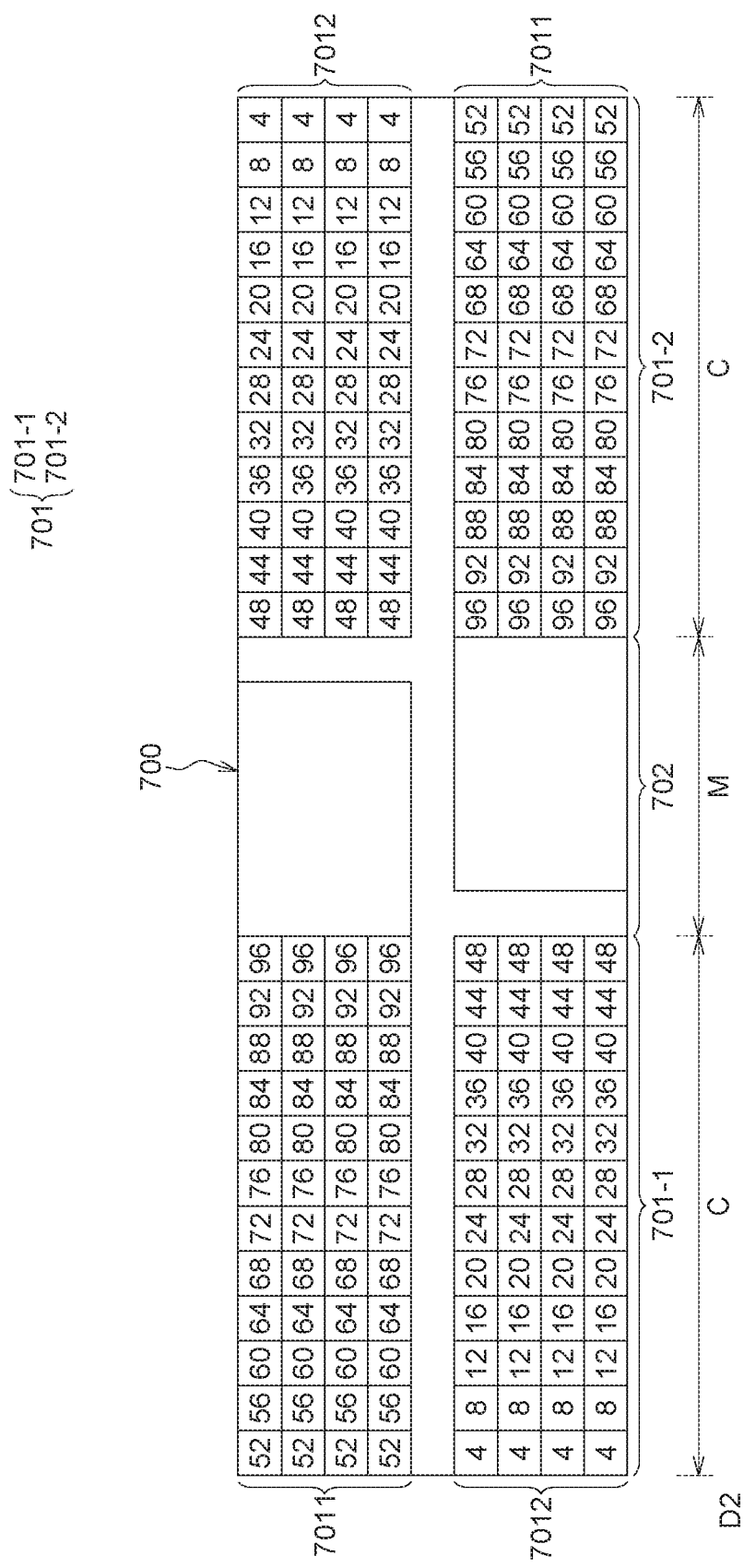
Figure 3Q:
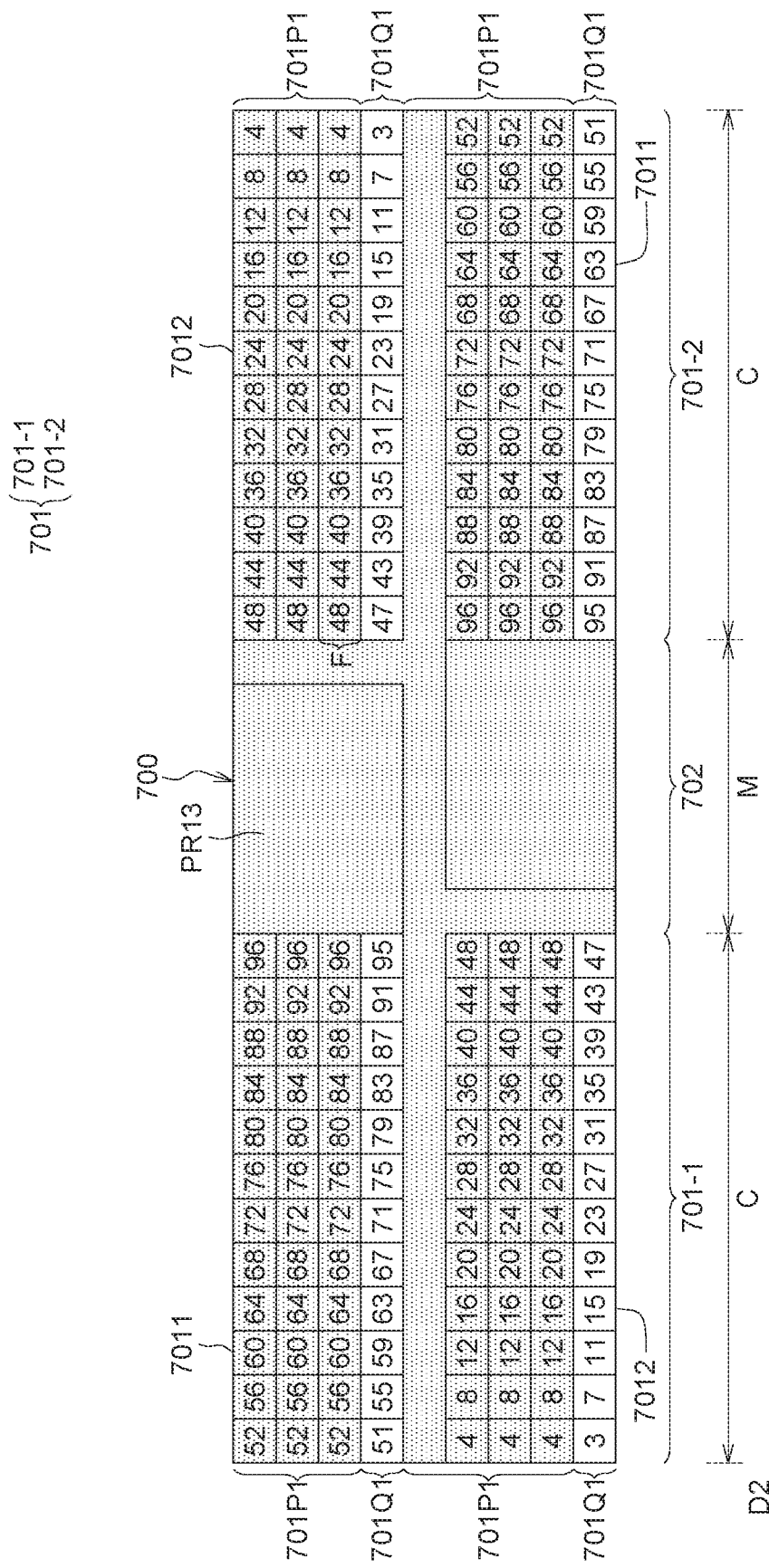
Figure 3R:
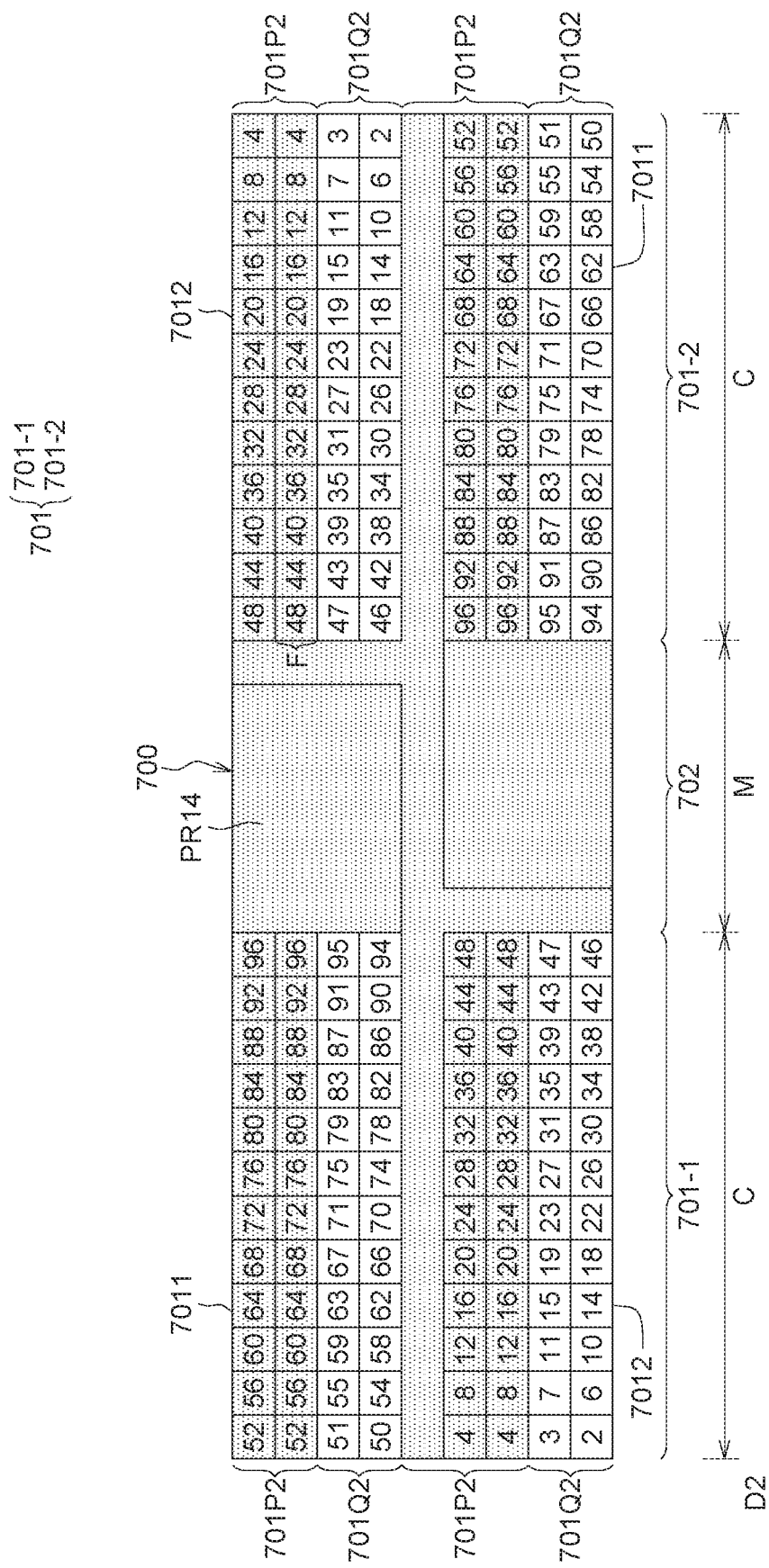
Figure 3S:
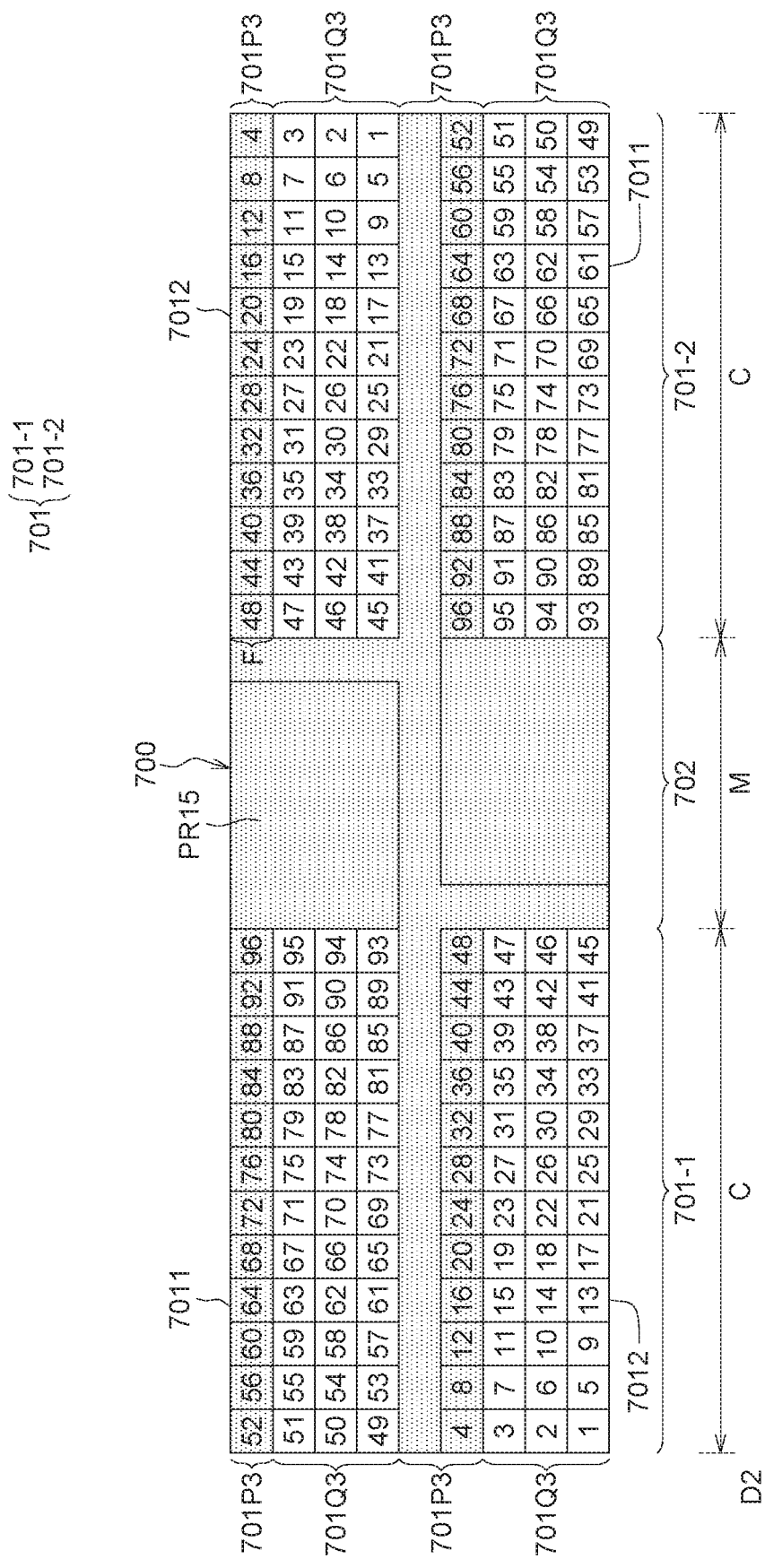
Figure 3T:
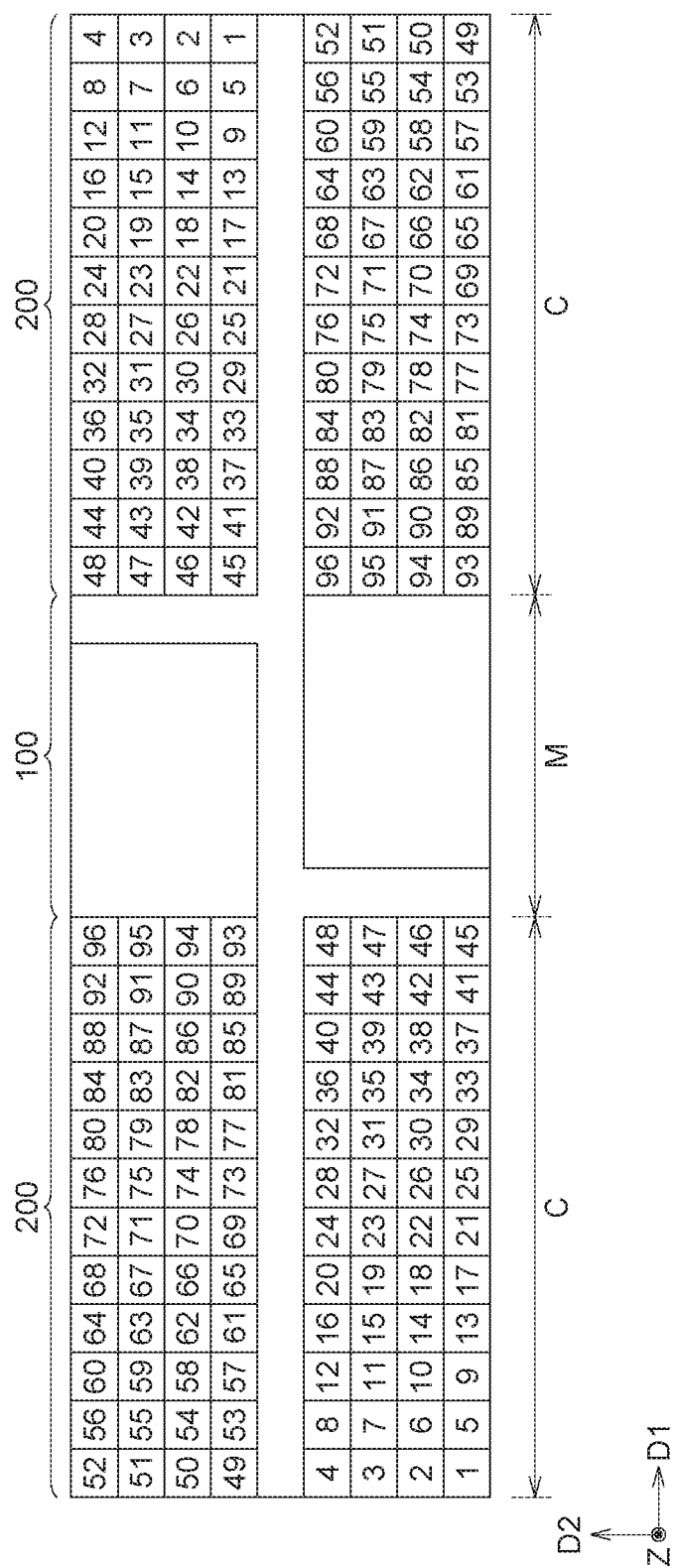

FIG. 3A to FIG. 3T illustrate a manufacturing method for memory device in an embodiment. The manufacturing method comprises manufacturing steps for forming a staircase structure by performing photolithography etching processes utilizing photoresist layers of different profiles to a stacked structure 700.

FIG. 3A is referred to. Conductive layers 707 and insulating layers 708 may be alternately stacked on a substrate (not shown) along the vertical direction Z to form the stacked structure 700. In this embodiment, the stacked structure 700 may comprise the conductive layers 707 of an amount of 96 layers, insulated from each other by the insulating layers 708. The stacked structure 700 comprises a first stacked portion 701 and a second stacked portion 702 arranged in the first direction D1. The first stacked portion 701 comprises a first stacked portion 701-1 and a first stacked portion 701-2 respectively on opposing sides of the second stacked portion 702. The first stacked portion 701-1 and the first stacked portion 701-2 are in the staircase contact region C. The second stacked portion 702 is in the memory array region M. The second stacked portion 702 may be stacked body structure 100. In an embodiment, a photoresist layer (not shown) may be formed to cover on the insulating layer 708 (such as a top insulating layer) of the second stacked portion 702, and an etching step using this photoresist layer (not shown) as an etching mask may be performed to remove the exposed the insulating layer 708 (such as the top insulating layer) of the first stacked portion 701 so as to expose the conductive layer 707 of the $96^{th}$ level (such as a conductive stair layer 96) of the first stacked portion 701. The photoresist layer may be removed then.

FIG. 3B is referred to. A photoresist layer PR1 is formed on the stacked structure 700. The photoresist layer PR1 covers the second stacked portion 702 and a first sub-stacked portion 7011 of the first stacked portion 701 (comprising the first stacked portion 701-1 and the first stacked portion 701-2), and exposes the conductive layer of the $96^{th}$ level (i.e. the conductive stair layer 96) of a second sub-stacked portion 7012 of the first stacked portion 701. With using the photoresist layer PR1 as an etching mask, the second sub-stacked portion 7012 is etched downward from the conductive layer of the $96^{th}$ level (i.e. the conductive stair layer 96) through 48 levels so as to expose the conductive layer of the $48^{th}$ level (i.e. a conductive stair layer 48) of the second sub-stacked portion 7012. The photoresist layer PR1 may be removed then. As such, a semiconductor structure as shown in FIG. 3C is formed.

Referring to FIG. 3D, a photoresist layer PR2 is formed on the stacked structure 700. The photoresist layer PR2 covers the second stacked portion 702, and extends along the first direction D1 to cover a portion of the first stacked portion 701. That is, the photoresist layer PR2 covers an inner stacked portion 701G1 of the first stacked portion 701 adjacent to the second stacked portion 702, and exposes an outer stacked portion 701K1 of the first stacked portion 701 away from the second stacked portion 702. With using the photoresist layer PR2 as an etching mask, the outer stacked portion 701K1 is etched downward from the exposed the conductive layer of the $96^{th}$ level (i.e. the conductive stair layer 96) and the exposed conductive layer of the $48^{th}$ level (i.e. the conductive stair layer 48) through 4 levels so as to expose the conductive layer of the $92^{nd}$ level (i.e. a conductive stair layer 92) and the conductive layer of the $44^{th}$ level (i.e. a conductive stair layer 44), respectively. Then the photoresist layer PR2 (previous photoresist layer) may be trimmed by the stair size E in the first direction D1 to form a photoresist layer PR3 (subsequent photoresist layer) shown in FIG. 3E. A size of the photoresist layer PR2 in the second direction D2 may be not trimmed, and therefore a size of the photoresist layer PR3 in the second direction D2 may be identical with a size of the photoresist layer PR2 in the second direction D2.

Referring to FIG. 3E, a photoresist layer PR3 is formed on the stacked structure 700. The photoresist layer PR3 covers the second stacked portion 702, and an inner stacked portion 701G2 of the first stacked portion 701, and exposes an outer stacked portion 701K2 of the first stacked portion 701. With using the photoresist layer PR3 as an etching mask, the outer stacked portion 701K2 is etched downward from the exposed the conductive layers (i.e. the conductive stair layer 96, the conductive stair layer 92, the conductive stair layer 48 and the conductive stair layer 44) through 4 levels. As such, a semiconductor structure as shown in FIG. 3F may be formed. Then the photoresist layer PR3 (previous photoresist layer) may be trimmed by the stair size E in the first direction D1 to form a photoresist layer PR4 (subsequent photoresist layer) shown in FIG. 3G. A size of the photoresist layer PR3 in the second direction D2 may be not trimmed, and therefore a size of the photoresist layer PR4 in the second direction D2 may be identical with a size of the photoresist layer PR3 in the second direction D2.

Referring to FIG. 3G, a photoresist layer PR4 is formed on the stacked structure 700. The photoresist layer PR4 covers the second stacked portion 702, and an inner stacked portion 701G3 of the first stacked portion 701, and exposes an outer stacked portion 701K3 of the first stacked portion 701. With using the photoresist layer PR4 as an etching mask, the outer stacked portion 701K3 is etched downward from the exposed the conductive layers (such as the conductive stair layers 96, 92, 88, 48, 44 and 40 as shown in FIG. 3F) through 4 levels so as to form the conductive stair layers 92, 88, 84, 44, 40 and 36 of the outer stacked portion 701K3 as shown in FIG. 3G. Then the photoresist layer PR4 (previous photoresist layer) may be trimmed by the stair size E in the first direction D1 to form a photoresist layer PR5 (subsequent photoresist layer) shown in FIG. 3H. A size of the photoresist layer PR4 in the second direction D2 may be not trimmed, and therefore a size of the photoresist layer PR5 in the second direction D2 may be identical with a size of the photoresist layer PR4 in the second direction D2.

Referring to FIG. 3H, a photoresist layer PR5 is formed on the stacked structure 700. The photoresist layer PR5 covers the second stacked portion 702, and an inner stacked portion 701G4 of the first stacked portion 701, and exposes an outer stacked portion 701K4 of the first stacked portion 701. With using the photoresist layer PR5 as an etching mask, the outer stacked portion 701K4 is etched downward from the exposed the conductive layers (i.e. the conductive stair layers 96, 92, 88, 84, 48, 44, 40 and 36) through 4 levels so as to form the conductive stair layers 92, 88, 84, 80, 44, 40, 36 and 32 of the outer stacked portion 701K4 as shown in FIG. 3H. Then the photoresist layer PR5 (previous photoresist layer) may be trimmed by the stair size E in the first direction D1 to form a photoresist layer PR6 (subsequent photoresist layer) shown in FIG. 3I. A size of the photoresist layer PR5 in the second direction D2 may be not trimmed, and therefore a size of the photoresist layer PR6 in the second direction D2 may be identical with a size of the photoresist layer PR5 in the second direction D2.

Referring to FIG. 3I, a photoresist layer PR6 is formed on the stacked structure 700. The photoresist layer PR6 covers the second stacked portion 702, and an inner stacked portion 701G5 of the first stacked portion 701, and exposes an outer stacked portion 701 K5 of the first stacked portion 701. With using the photoresist layer PR6 as an etching mask, the outer stacked portion 701K5 is etched downward from the exposed the conductive layers (i.e the conductive stair layers 96, 92, 88, 84, 80, 48, 44, 40, 36 and 32) through 4 levels so as to form the conductive stair layers 92, 88, 84, 80, 76, 44, 40, 36, 32 and 28 of the outer stacked portion 701K5 as shown in FIG. 3I. Then the photoresist layer PR6 (previous photoresist layer) may be trimmed by the stair size E in the first direction D1 to form a photoresist layer PR7 (subsequent photoresist layer) shown in FIG. 3J. A size of the photoresist layer PR6 in the second direction D2 may be not trimmed, and therefore a size of the photoresist layer PR7 in the second direction D2 may be identical with a size of the photoresist layer PR6 in the second direction D2.

Referring to FIG. 3J, a photoresist layer PR7 is formed on the stacked structure 700. The photoresist layer PR7 covers the second stacked portion 702, and an inner stacked portion 701G6 of the first stacked portion 701, and exposes an outer stacked portion 701K6 of the first stacked portion 701. With using the photoresist layer PR7 as an etching mask, the outer stacked portion 701K6 is etched downward from the exposed the conductive layers (i.e. the conductive stair layers 92, 88, 84, 80, 76, 44, 40, 36, 32 and 28) through 4 levels so as to form the conductive stair layers 92, 88, 84, 80, 76, 72, 44, 40, 36, 32, 28 and 24 of the outer stacked portion 701 K6 as shown in FIG. 3J. Then the photoresist layer PR7 (previous photoresist layer) may be trimmed by the stair size E in the first direction D1 to form a photoresist layer PR8 (subsequent photoresist layer) shown in FIG. 3K. A size of the photoresist layer PR7 in the second direction D2 may be not trimmed, and therefore a size of the photoresist layer PR8 in the second direction D2 may be identical with a size of the photoresist layer PR7 in the second direction D2.

Referring to FIG. 3K, a photoresist layer PR8 is formed on the stacked structure 700. The photoresist layer PR8 covers the second stacked portion 702, and an inner stacked portion 701G7 of the first stacked portion 701, and exposes an outer stacked portion 701K7 of the first stacked portion 701. With using the photoresist layer PR8 as an etching mask, the outer stacked portion 701K7 is etched downward from the exposed the conductive layers (i.e, the conductive stair layers 92, 88, 84, 80, 76, 72, 44, 40, 36, 32, 28 and 24) through 4 levels so as to form the conductive stair layers 92, 88, 84, 80, 76, 72, 68, 44, 40, 36, 32, 28, 24 and 20 of the outer stacked portion 701K7 as shown in FIG. 3K. Then the photoresist layer PR8 (previous photoresist layer) may be trimmed by the stair size E in the first direction D1 to form a photoresist layer PR9 (subsequent photoresist layer) shown in FIG. 3L. A size of the photoresist layer PR8 in the second direction D2 may be not trimmed, and therefore a size of the photoresist layer PR9 in the second direction D2 may be identical with a size of the photoresist layer PR8 in the second direction D2.

Referring to FIG. 3L, a photoresist layer PR9 is formed on the stacked structure 700. The photoresist layer PR9 covers the second stacked portion 702, and an inner stacked portion 701G8 of the first stacked portion 701, and exposes an outer stacked portion 701K8 of the first stacked portion 701. With using the photoresist layer PR9 as an etching mask, the outer stacked portion 701K8 is etched downward from the exposed the conductive layers (i.e. the conductive stair layers 92, 88, 84, 80, 76, 72, 68, 44, 40, 36, 32, 28, 24 and 20) through 4 levels so as to form the conductive stair layers 92, 88, 84, 80, 76, 72, 68, 64, 44, 40, 36, 32, 28, 24, 20 and 16 of the outer stacked portion 701K8 as shown in FIG. 3L. Then the photoresist layer PR9 (previous photoresist layer) may be trimmed by the stair size E in the first direction D1 to form a photoresist layer PR10 (subsequent photoresist layer) shown in FIG. 3M. A size of the photoresist layer PR9 in the second direction D2 may be not trimmed, and therefore a size of the photoresist layer PR10 in the second direction D2 may be identical with a size of the photoresist layer PR9 in the second direction D2.

Referring to FIG. 3M, a photoresist layer PR10 is formed on the stacked structure 700. The photoresist layer PR10 covers the second stacked portion 702, and an inner stacked portion 701G9 of the first stacked portion 701, and exposes an outer stacked portion 701 K9 of the first stacked portion 701. With using the photoresist layer PR10 as an etching mask, the outer stacked portion 701K9 is etched downward from the exposed the conductive layers (i.e. the conductive stair layers 92, 88, 84, 80, 76, 72, 68, 64, 44, 40, 36, 32, 28, 24, 20 and 16) through 4 levels so as to form the conductive stair layers 92, 88, 84, 80, 76, 72, 68, 64, 60, 44, 40, 36, 32, 28, 24, 20, 16 and 12 of the outer stacked portion 701K9 as shown in FIG. 3M. Then the photoresist layer PR10 (previous photoresist layer) may be trimmed by the stair size E in the first direction D1 to form a photoresist layer PR11 (subsequent photoresist layer) shown in FIG. 3N. A size of the photoresist layer PR10 in the second direction D2 may be not trimmed, and therefore a size of the photoresist layer PR11 in the second direction D2 may be identical with a size of the photoresist layer PR10 in the second direction D2.

Referring to FIG. 3N, a photoresist layer PR11 is formed on the stacked structure 700. The photoresist layer PR11 covers the second stacked portion 702, and an inner stacked portion 701G10 of the first stacked portion 701, and exposes an outer stacked portion 701K10 of the first stacked portion 701. With using the photoresist layer PR11 as an etching mask, the outer stacked portion 701K10 is etched downward from the exposed the conductive layers (i.e. the conductive stair layers 92, 88, 84, 80, 76, 72, 68, 64, 60, 44, 40, 36, 32, 28, 24, 20, 16 and 12) through 4 levels so as to form the conductive stair layers 92, 88, 84, 80, 76, 72, 68, 64, 60, 56, 44, 40, 36, 32, 28, 24, 20, 16, 12 and 8 of the outer stacked portion 701K10 as shown in FIG. 3N. Then the photoresist layer PR11 (previous photoresist layer) may be trimmed by the stair size E in the first direction D1 to form a photoresist layer PR12 (subsequent photoresist layer) shown in FIG. 3O. A size of the photoresist layer PR11 in the second direction D2 may be not trimmed, and therefore a size of the photoresist layer PR12 in the second direction D2 may be identical with a size of the photoresist layer PR11 in the second direction D2.

Referring to FIG. 3O, a photoresist layer PR12 is formed on the stacked structure 700. The photoresist layer PR12 covers the second stacked portion 702, and an inner stacked portion 701G11 of the first stacked portion 701, and exposes an outer stacked portion 701K11 of the first stacked portion 701. With using the photoresist layer PR12 as an etching mask, the outer stacked portion 701K11 is etched downward from the exposed the conductive layers (i.e. the conductive stair layers 92, 88, 84, 80, 76, 72, 68, 64, 60, 56, 44, 40, 36, 32, 28, 24, 20, 16, 12 and 8) through 4 levels so as to form the conductive stair layers 92, 88, 84, 80, 76, 72, 68, 64, 60, 56, 52, 44, 40, 36, 32, 28, 24, 20, 16, 12, 8 and 4 of the outer stacked portion 701K11 as shown in FIG. 3O. The photoresist layer PR12 may be removed then. As such, a semiconductor structure as shown in FIG. 3P may be formed.

Referring to FIG. 3Q, a photoresist layer PR13 is formed on the stacked structure 700. The photoresist layer PR13 covers the second stacked portion 702, and extends along the first direction D1 to cover a portion of the first stacked portion 701. That is, the photoresist layer PR13 covers a stacked part 701P1 of the first sub-stacked portion 7011 and the second sub-stacked portion 7012 of the first stacked portion 701, and exposes a stacked part 70101 of the first sub-stacked portion 7011 and the second sub-stacked portion 7012. With using the photoresist layer PR13 as an etching mask, the stacked part 70101 is etched downward from the exposed conductive layers through 1 level so as to form the stacked part 70101 having the conductive stair layers of an arrangement as shown in FIG. 3Q. Then the photoresist layer PR13 (previous photoresist layer) may be trimmed by the stair size E in the second direction D2 to form a photoresist layer PR14 (subsequent photoresist layer) shown in FIG. 3R. A size of the photoresist layer PR13 in the first direction D1 may be not trimmed, and therefore a size of the photoresist layer PR14 in the first direction D1 may be identical with a size of the photoresist layer PR13 in the first direction D1.

Referring to FIG. 3R, a photoresist layer PR14 is formed on the stacked structure 700. The photoresist layer PR14 covers the second stacked portion 702, and a stacked part 701P2 of the first sub-stacked portion 7011 and the second sub-stacked portion 7012 of the first stacked portion 701, and exposes a stacked part 70102 of the first sub-stacked portion 7011 and the second sub-stacked portion 7012. With using the photoresist layer PR14 as an etching mask, the stacked part 70102 is etched downward from the exposed conductive layers through 1 level so as to form the stacked part 701Q2 having the conductive stair layers of an arrangement as shown in FIG. 3R. Then the photoresist layer PR14 (previous photoresist layer) may be trimmed by the stair size E in the second direction D2 to form a photoresist layer PR15 (subsequent photoresist layer) shown in FIG. 3S. A size of the photoresist layer PR14 in the first direction D1 may be not trimmed, and therefore a size of the photoresist layer PR15 in the first direction D1 may be identical with a size of the photoresist layer PR14 in the first direction D1.

Referring to FIG. 3S, a photoresist layer PR15 is formed on the stacked structure 700. The photoresist layer PR15 covers the second stacked portion 702, and a stacked part 701P3 of the first sub-stacked portion 7011 and the second sub-stacked portion 7012 of the first stacked portion 701, and exposes a stacked part 70103 of the first sub-stacked portion 7011 and the second sub-stacked portion 7012. With using the photoresist layer PR15 as an etching mask, the stacked part 70103 is etched downward from the exposed conductive layers through 1 level so as to form the stacked part 70103 having the conductive stair layers of an arrangement as shown in FIG. 3S. The photoresist layer PR15 may be removed then. As such, a semiconductor structure as shown in FIG. 3T may be formed, which comprises the stacked body structure 100 and the staircase structure 200 similar with those described with referring to FIG. 1.

According to the manufacturing method described above, the staircase structure 200 is formed by etching the first stacked portion 701 through utilizing the photoresist layers of different profiles as etching masks. For example, in the staircase contact region C, sizes of the photoresist layers in the first direction D1 and/or the second direction D2 are different from each other. The photoresist layer PR1 in FIG. 3B, the photoresist layer PR13 in FIG. 3Q, the photoresist layer PR14 in FIG. 3R, and the photoresist layer PR15 in FIG. 3S have photoresist portions having the same size in the first direction D1 in the staircase contact region C, and having the different sizes in the second direction D2 in the staircase contact region C. The photoresist layer PR2 in FIG. 3D, the photoresist layer PR3 in FIG. 3E and FIG. 3F, the photoresist layer PR4 in FIG. 3G, the photoresist layer PR5 in FIG. 3H, the photoresist layer PR6 in FIG. 3I, the photoresist layer PR7 in FIG. 3J, the photoresist layer PR8 in FIG. 3K, the photoresist layer PR9 in FIG. 3L, the photoresist layer PR10 in FIG. 3M, the photoresist layer PR11 in FIG. 3N and the photoresist layer PR12 in FIG. 3O have photoresist portions having the same size in the second direction D2 in the staircase contact region C, and having the different sizes in the first direction D1 in the staircase contact region C. Other possible interpretations for the photoresist layers of the different profiled may be understood with referring to the figures.

The present disclosure is not limited to the manufacturing method described above. For example, other process parameters such as an arrangement for photoresist layer, an etching sequence, and so on may be used according to actual process experiences.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
a stacked body structure comprising a first sub-stacked body structure and a second sub-stacked body structure; and
a staircase structure electrically connected to the stacked body structure, and comprising a first sub-staircase structure and a second sub-staircase structure respectively disposed on opposing sides of the stacked body structure which extends through and between the first sub-staircase structure and the second sub-staircase structure, wherein each of the first sub-staircase structure and the second sub-staircase structure comprises a first staircase portion and a second staircase portion, the first sub-stacked body structure and the second sub-stacked body structure are respectively connected to the first staircase portion of the first sub-staircase structure and the first staircase portion of the second sub-staircase structure.

2. The memory device according to claim 1, wherein the first sub-stacked body structure and the first sub-staircase structure are arranged along a first direction, the first sub-stacked body structure has a uniform size in a second direction, the first direction is perpendicular to the second direction.

3. The memory device according to claim 1, wherein the first sub-stacked body structure and the first sub-staircase structure are arranged along a first direction, the first sub-stacked body structure has a varied size in a second direction, the first direction is perpendicular to the second direction.

4. The memory device according to claim 3, wherein a size in the second direction of a portion of the first sub-stacked body structure far away from the first sub-staircase structure is smaller than another portion in the second direction of the first sub-stacked body structure adjacent to the first sub-staircase structure.

5. The memory device according to claim 1, wherein the first sub-stacked body structure is between the first staircase portion of the first sub-staircase structure and the second staircase portion of the second sub-staircase structure, the second sub-stacked body structure is between the second staircase portion of the first sub-staircase structure and the first staircase portion of the second sub-staircase structure.

6. The memory device according to claim 1, wherein the first sub-staircase structure and the second sub-staircase structure individually have a L shape.

7. The memory device according to claim 1, wherein stair levels of the first staircase portions are higher than stair levels of the second staircase portions.

8. The memory device according to claim 1, further comprising an insulating element, wherein the first sub-stacked body structure and the first sub-staircase structure are electrically insulated from the second sub-stacked body structure and the second sub-staircase structure by the insulating element.

9. The memory device according to claim 8, wherein the insulating element has a shape of  .

10. The memory device according to claim 1, wherein each of the first sub-stacked body structure and the second sub-stacked body structure comprises a first stacked body portion and a second stacked body portion.

11. The memory device according to claim 10, wherein the second stacked body portion of the first sub-stacked body structure is between the first stacked body portion of the second sub-stacked body structure and the second staircase portion of the first sub-staircase structure.

12. The memory device according to claim 10, wherein the second stacked body portion of the first sub-stacked body structure is connected to the second staircase portion of the first sub-staircase structure, the second stacked body portion of the second sub-stacked body structure is connected to the second staircase portion of the second sub-staircase structure.

13. The memory device according to claim 12, wherein the first stacked body portion of the first sub-stacked body structure is connected to the first staircase portion of the first sub-staircase structure, the first stacked body portion of the second sub-stacked body structure is connected to the first staircase portion of the second sub-staircase structure.

14. The memory device according to claim 13, wherein stair levels of the first staircase portion of one sub-staircase structure of the first sub-staircase structure and the second sub-staircase structure are higher than stair levels of the second staircase portion of the one sub-staircase structure, or are lower than the stair levels of the second staircase portion of the one sub-staircase structure.

15. The memory device according to claim 1, comprising memory cells defined in the first sub-stacked body structure and the second sub-stacked body structure.

16. A manufacturing method for the memory device according to claim 1, comprising:
stacking conductive layers and insulating layers alternately along a vertical direction to form a stacked structure, wherein the stacked structure comprises a first stacked portion, a second stacked portion and another first stacked portion disposed along a first direction, the first stacked portion and the another first stacked portion are respectively on opposing sides of the second stacked portion, the first stacked portion and the another first stacked portion are in a staircase contact region, the second stacked portion is in a memory array region; and etching the first stacked portion and the another first stacked portion with using photoresist layers to form a staircase structure, wherein in the staircase contact region, sizes of the photoresist layers in the first direction and/or a second direction are different from each other, the first direction, the second direction and the vertical direction are perpendicular to each other, wherein the first sub-stacked body structure and the second sub-stacked body structure comprise the second stacked portion.

17. The manufacturing method for the memory device according to claim 16, wherein the photoresist layers comprise a previous photoresist layer and a subsequent photoresist layer, the subsequent photoresist layer is formed by trimming the previous photoresist layer in the first direction and/or the second direction.

18. The manufacturing method for the memory device according to claim 16, wherein the staircase structure has stair units each having a stair size in the first direction, the photoresist layers comprise a previous photoresist layer and a subsequent photoresist layer, the subsequent photoresist layer is formed by trimming the previous photoresist layer by the stair size, a size of the subsequent photoresist layer in the second direction is identical with a size of the previous photoresist layer in the second direction.

19. The manufacturing method for the memory device according to claim 16, wherein the staircase structure has stair units each having a stair size in the second direction, the photoresist layers comprise a previous photoresist layer and a subsequent photoresist layer, the subsequent photoresist layer is formed by trimming the previous photoresist layer by the stair size, a size of the subsequent photoresist layer in the first direction is identical with a size of the previous photoresist layer in the first direction.

20. The manufacturing method for the memory device according to claim 16, wherein the photoresist layers cover the second stacked portion and extend onto the first stacked portion and the another first stacked portion.

* * * * *